(12) United States Patent
Heo et al.

(10) Patent No.: US 10,496,204 B2
(45) Date of Patent: Dec. 3, 2019

(54) DISPLAY DEVICE WITH INTEGRATED TOUCH SCREEN AND MIRROR FUNCTION, AND METHOD FOR FABRICATING THE SAME

(71) Applicant: LG DISPLAY CO., LTD., Seoul (KR)

(72) Inventors: JoonYoung Heo, Seoul (KR); ChoongKeun Yoo, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 43 days.

(21) Appl. No.: 15/820,587

(22) Filed: Nov. 22, 2017

(65) Prior Publication Data

US 2018/0188866 A1 Jul. 5, 2018

(30) Foreign Application Priority Data

Dec. 30, 2016 (KR) .................. 10-2016-0183672

(51) Int. Cl.
*G06F 3/041* (2006.01)
*H01L 27/32* (2006.01)
*G06F 3/044* (2006.01)
*H01L 51/52* (2006.01)

(52) U.S. Cl.
CPC .......... *G06F 3/0412* (2013.01); *G06F 3/044* (2013.01); *G06F 3/0416* (2013.01); *H01L 27/323* (2013.01); *H01L 27/3246* (2013.01); *H01L 51/5253* (2013.01); *G06F 2203/04103* (2013.01); *G06F 2203/04111* (2013.01); *H01L 27/3213* (2013.01); *H01L 2227/323* (2013.01)

(58) Field of Classification Search
CPC .............. G06F 3/041–047; G06F 2203/04103
See application file for complete search history.

(56) References Cited

U.S. PATENT DOCUMENTS

2016/0378224 A1* 12/2016 Kwon ................. H01L 51/5256
345/174
2017/0075452 A1* 3/2017 Kim ........................ G06F 3/044

* cited by examiner

*Primary Examiner* — Laurence J Lee
(74) *Attorney, Agent, or Firm* — Birch, Stewart, Kolasch & Birch, LLP

(57) ABSTRACT

Disclosed is a display device with integrated touch screen which is capable of providing a mirror function, and minimizing the increase of thickness, and a method for fabricating the same, wherein the display device may include a substrate including a light-emission area and a non-emission area, first touch electrodes extending in a first direction on the substrate, and second touch electrodes extending in a second direction on the substrate, wherein the second direction intersects the first direction, and wherein at least one of the first and second touch electrodes is provided with an opening corresponding to the light-emission area.

21 Claims, 22 Drawing Sheets

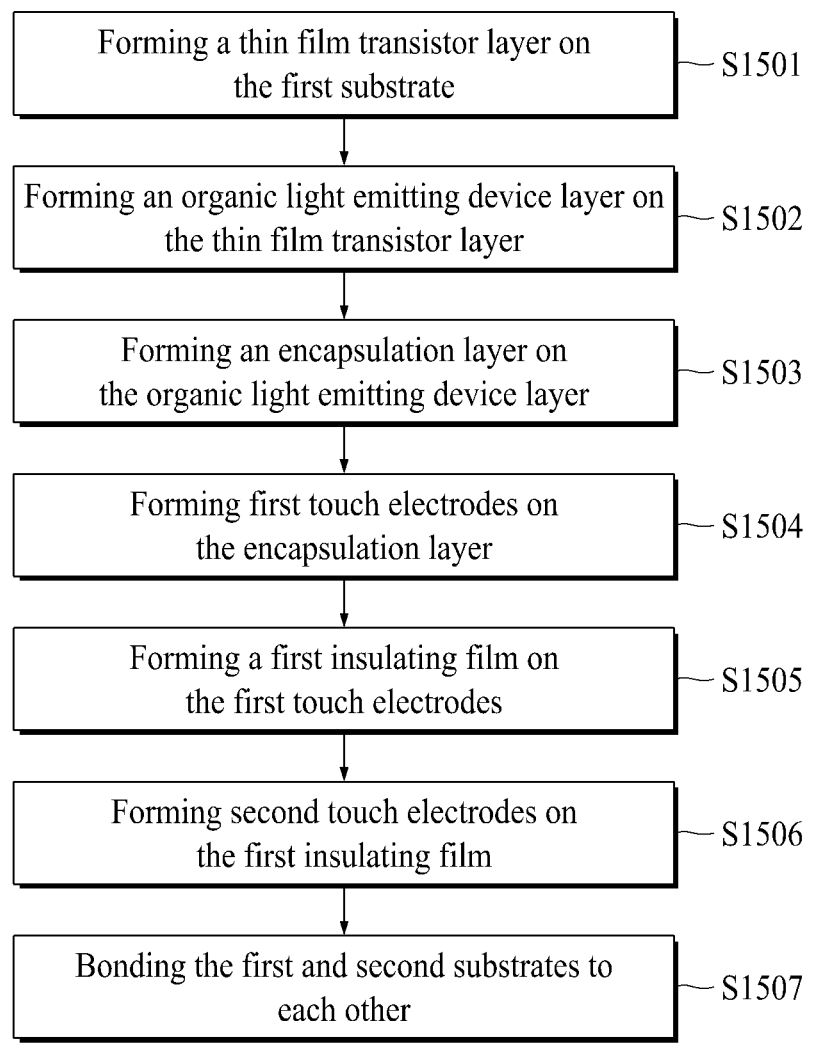

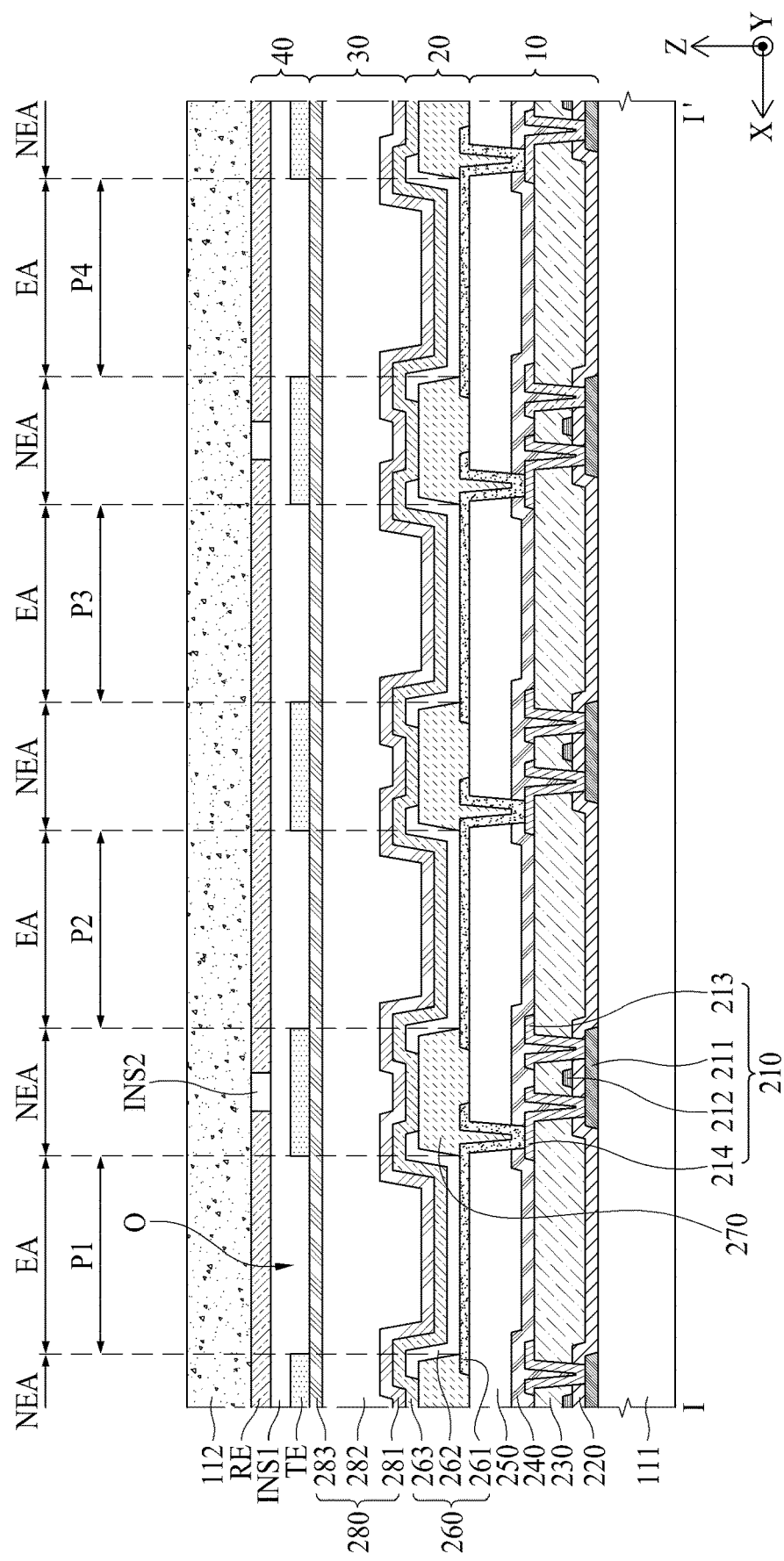

DISPLAY DEVICE WITH INTEGRATED TOUCH SCREEN AND MIRROR FUNCTION, AND METHOD FOR FABRICATING THE SAME

CROSS REFERENCE TO RELATED APPLICATION

This application claims the benefit of the Korean Patent Application No. 10-2016-0183672 filed on Dec. 30, 2016, the disclosure of which is hereby incorporated by reference in its entirety.

BACKGROUND OF THE INVENTION

Field of the Invention

Embodiments of the present invention relate to a display device with integrated touch screen, and a method for fabricating the same.

Discussion of the Related Art

With the advancement of an information-oriented society, various requirements for the display device of displaying an image are increasing. Thus, there are various display devices of liquid crystal display (LCD) devices, plasma display panel (PDP) devices, organic light emitting display (OLED) devices, etc. Among these display devices, the OLED device has advantages of low-voltage driving, thin profile, wide viewing angle, and rapid response speed.

The OLED device may include a display panel having data lines, scan lines, and a plurality of pixels provided every intersection of the data and scan lines, a scan driver for supplying scan signals to the scan lines, and a data driver for supplying data voltages to the data lines. Each of the pixels may include an organic light emitting device, a driving transistor for controlling an amount of current supplied to the organic light emitting device in accordance with a voltage of a gate electrode, and a scan transistor for supplying the data voltage of the data line to the gate electrode of the driving transistor in response to the scan signal of the scan line.

Recently, the OLED device may be formed in a display device with integrated touch screen including touch electrodes capable of sensing a user's touch. In this instance, the OLED device may function as a touch screen apparatus. Recently, the touch screen apparatus is widely applied to home appliances such as refrigerator, microwave and washing machine as well as monitors for navigation, industrial terminal, notebook computer, banking automation device and game console, and mobile terminals such as smart phone, tablet, mobile phone, MP3, PDA, PMP, PSP, mobile game console, DMB receiver and tablet PC. Also, the touch screen apparatus has become widely used due to an easy operation.

A display device with integrated touch screen may be obtained by preparing a first substrate with organic light emitting devices, preparing a second substrate with touch electrodes, and bonding the first and second substrates to each other by the use of adhesive layer. In this instance, a thickness in the display device with integrated touch screen may be increased due to the adhesive layer.

Recently, the display device with integrated touch screen may be designed to realize a mirror function as well as an image-displaying function. In order to realize the mirror function, a reflective film is formed between the touch electrodes and the second substrate in the display device with integrated touch screen. Accordingly, the display device with integrated touch screen may display an image by the pixels which emit light, or may function as a mirror by reflecting ambient light through the use of reflective film when an image is not displayed.

However, the reflective film is additionally formed between the second substrate and the touch electrodes in the display device with integrated touch screen, whereby the thickness of the display device with integrated touch screen may be increased.

SUMMARY OF THE INVENTION

Accordingly, embodiments of the present invention are directed to a display device with integrated touch screen that substantially obviate one or more problems due to limitations and disadvantages of the related art, and a method for fabricating the same.

An aspect of embodiments of the present invention is directed to provide a display device with integrated touch screen with a minimum thickness, and a method for fabricating the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a display device that may include a substrate including a light-emission area and a non-emission area, first touch electrodes extending in a first direction on the substrate, and second touch electrodes extending in a second direction on the substrate, wherein the second direction intersects the first direction, wherein at least one of the first and second touch electrodes is provided with an opening corresponding to the light-emission area.

In another aspect of an embodiment of the present invention, there is provided a method for fabricating a display device that may include forming a plurality of pixels on a first substrate, and forming a bank for dividing the plurality of pixels, forming an encapsulation film for covering the plurality of pixels and the bank, and forming first touch electrodes extending in a first direction and second touch electrodes in a second direction on the encapsulation film, wherein the first direction intersects the second direction, wherein at least one of the first and second touch electrodes is provided with an opening corresponding to the bank.

It is to be understood that both the foregoing general description and the following detailed description of embodiments of the present invention are by example and explanatory and are intended to provide a further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 15 is a flow chart illustrating a method for fabricating the display device with integrated touch screen according to one embodiment of the present invention; and FIGS. 16A to 16G are cross sectional views illustrating the method for fabricating the display device with integrated touch screen according to one embodiment of the present invention.

DETAILED DESCRIPTION OF THE EMBODIMENTS

Figure 1:
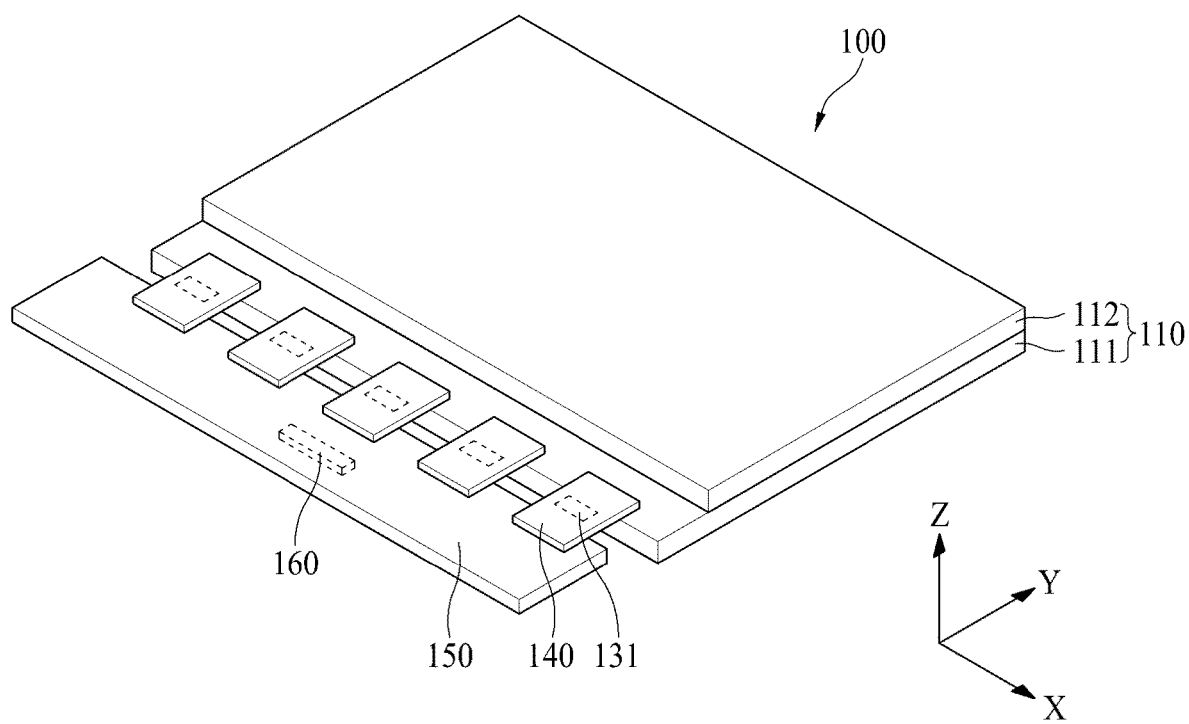
FIG. 1 is a perspective view illustrating a display device with integrated touch screen according to one embodiment of the present invention.

Reference will now be made in detail to the example embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', an instance which is not in contact may be included unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in a co-dependent relationship.

Hereinafter, a display device with an integrated touch screen according to the embodiment of the present invention and a method for fabricating the same will be described with reference to the accompanying drawings.

Figure 2:
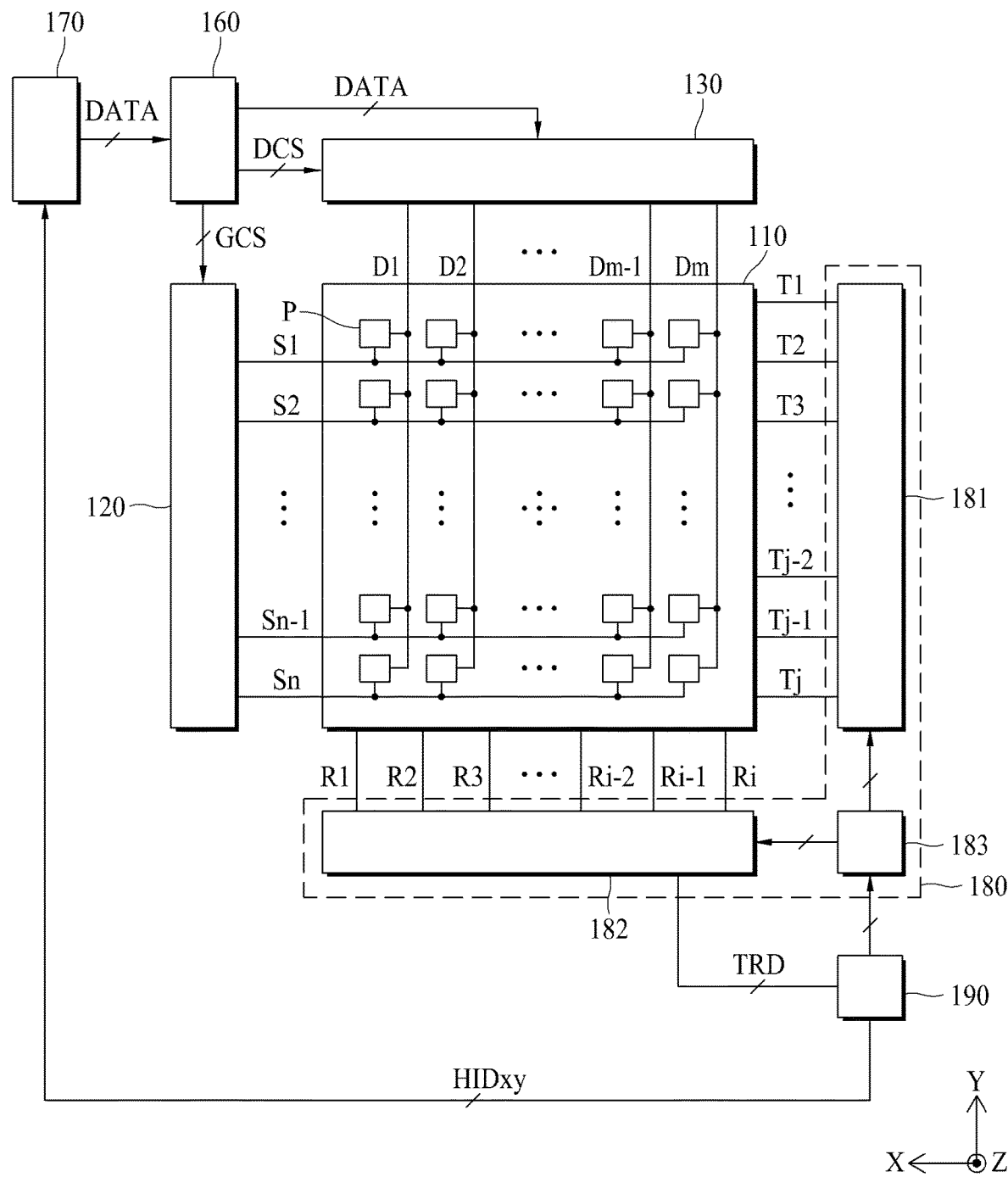
FIG. 2 is a block diagram illustrating the display device with integrated touch screen according to one embodiment of the present invention.

FIG. 1 is a perspective view illustrating a display device with integrated touch screen according to one embodiment of the present invention. FIG. 2 is a block diagram illustrating the display device with integrated touch screen according to one embodiment of the present invention.

Referring to FIGS. 1 and 2, the display device 100 with an integrated touch screen according to one embodiment of the present invention may include a display panel 110, a scan driver 120, a data driver 130, a timing controller 160, a host system 170, a touch driver 180, and a touch coordinates calculator 190.

The display device with integrated touch screen according to the embodiment of the present invention may be realized in various flat display devices, for example, liquid crystal display (LCD) device, field emission display (FED) device, plasma display panel (PDP), organic light emitting display (OLED) device, electrophoresis (EPD) device, and etc. Hereinafter, the display device with integrated touch screen according to the embodiment of the present invention is realized in the OLED device, but is not limited to this type.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film (protection film).

The display panel 110 includes a display area with pixels (P) prepared to display an image. The display panel 110 may include data lines (D1~Dm, 'm' is an integer of 2 or more than 2), and scan lines (S1~Sn, 'n' is an integer of 2 or more than 2). The data lines (D1~Dm) may intersect with the scan lines (S1~Sn). Herein, the pixels (P) may be formed at respective intersection areas defined by the gate and data lines crossing each other.

Each of the pixels (P) of the display panel 110 may be connected with any one of the data lines (D1~Dm) and any one of the scan lines (S1~Sn). Each of the pixels (P) of the display panel 110 may include a driving transistor for controlling a drain-to-source current in accordance to a data voltage supplied to a gate electrode, a scan transistor which is turned-on by a scan signal of the scan line so as to supply the data voltage of the data line to the gate electrode of the driving transistor, an organic light emitting diode which emits light in accordance with the drain-to-source current of the driving transistor, and a capacitor for storing the voltage of the gate electrode of the driving transistor. Thus, each of the pixels (P) may emit light in accordance with a current supplied to the organic light emitting diode.

The scan driver 120 receives a scan control signal (GCS) from the timing controller 160. The scan driver 120 supplies the scan signals to the scan lines (S1~Sn) in accordance with the scan control signal (GCS).

The scan driver 120 may be disposed in a non-display area at one peripheral side or both peripheral sides of the display area of the display panel 110 by a gate driver in panel (GIP) method. In another way, the scan driver 120 may be fabricated in a driving chip, and mounted on a flexible film, wherein the scan driver 120 of the driving chip may be attached to the non-display area at one peripheral side or both peripheral sides of the display area of the display panel 110 by a tape automated bonding (TAB) method.

The data driver 130 receives digital video data (DATA) and data control signal (DCS) from the timing controller 160. The data driver 130 converts the digital video data (DATA) to an analog positive/negative data voltage in accordance with the data control signal (DCS), and supplies the analog positive/negative data voltage to the data lines. That is, the pixels to be supplied with the data voltages are selected by the scan signals of the scan driver 120, and the data voltages are supplied to the selected pixels.

As shown in FIG. 1, the data driver 130 may include a plurality of source drive ICs 131. Each of the plurality of source drive ICs 131 may be mounted on a flexible film 140 by a chip on film (COF) or chip on plastic (COP) method. The flexible film 140 is attached onto pads prepared in the non-display area of the display panel 110 by the use of anisotropic conducting film, whereby the plurality of source drive ICs 131 may be connected with the pads.

A circuit board 150 may be attached to the flexible films 140. A plurality of circuits formed of driving chips may be mounted on the circuit board 150. For example, the timing controller 160 may be mounted on the circuit board 150. The circuit board 150 may be a printed circuit board or a flexible printed circuit board.

The timing controller 160 receives the digital video data (DATA) and timing signals from the host system 170. The timing signals may include a vertical synchronization signal, a horizontal synchronization signal, a data enable signal, a dot clock, and etc. The vertical synchronization signal defines 1 frame period. The horizontal synchronization signal defines 1 horizontal period needed to supply the data voltages to the pixels for 1 horizontal line of the display panel (DIS). The data enable signal defines a period of inputting valid data. The dot clock is a signal which is repeated every preset short time period.

In order to control an operation timing of each of the scan driver 120 and the data driver 130, the timing controller 160 generates a data control signal (DCS) for controlling the operation timing of the data driver 130, and a scan control signal (GCS) for controlling the operation timing of the scan driver 120 on the basis of timing signals. The timing controller 160 outputs the scan control signal (GCS) to the scan driver 120, and outputs the digital video data (DATA) and the data control signal (DCS) to the data driver 130.

The host system 170 may be realized in a navigation system, a set top box, a DVD player, a blu-ray player, a personal computer (PC), a home theater system, a broadcasting receiver, a phone system, and etc. The host system 170 includes a SoC (system on chip) with a scaler, which enables to convert the digital video data (DATA) of input image into a format appropriate for the display on the display panel (DIS). The host system 170 transmits the digital video data (DATA) and timing signals to the timing controller 160.

On the display panel 10, there are first touch electrodes, and second touch electrodes as well as the data lines (D1~Dm) and the scan lines (S1~Sn). The first touch electrodes may intersect with the second touch electrodes. The first touch electrodes may be connected with a first touch driver 181 through first touch lines (T1~Tj, where 'j' is an integer of 2 or more than 2). The second touch electrodes may be connected with a second touch driver 182 through second touch lines (R1~Ri, where 'i' is an integer of 2 or more than 2). Touch sensors may be formed at respective intersections of the first touch electrodes and the second touch electrodes. According to the embodiment of the present invention, each of the touch sensors according to the embodiment of the present invention may be realized by a mutual capacitance, but is not limited to this type. The first and second touch electrodes will be described in detail with reference to FIG. 4.

The touch driver 180 supplies a driving pulse to the first touch electrodes through the first touch lines (T1~Tj), and senses the change of charge amount in each of the touch sensors through the second touch lines (R1~Ri). That is, in FIG. 2, the first touch lines (T1~Tj) correspond to Tx lines for supplying the driving pulse, and the second touch lines (R1~Ri) correspond to Rx lines for sensing the change of charge amount in each of the touch sensors.

The touch driver 180 includes the first touch driver 181, the second touch driver 182, and a touch controller 183. The first touch driver 181, the second touch driver 182, and the touch controller 183 may be integrated in one read-out IC (ROIC).

The first touch driver 181 selects the first touch line to be supplied with the driving pulse under control of the touch controller 183, and supplies the driving pulse to the selected first touch line. For example, the first touch driver 181 may supply the driving pulses to the first touch lines (T1~Tj) in sequence.

The second touch driver 182 selects the second touch lines to be received with the change of charge amount in the touch sensors under control of the touch controller 183, and receives the change of charge amount in the touch sensors through the selected second touch lines. For example, the second touch driver 182 may sample the change of charge amount in the touch sensors, which is received through the second touch lines (R1~Ri), and convert the sampled one into touch raw data (TRD) corresponding to digital data.

The touch controller 183 may generate a TX setup signal for setting the first touch line to be supplied with the driving pulse by the first touch driver 181, and a Rx setup signal for setting the second touch line to be received with a touch sensor voltage by the second touch driver 182. Also, the touch controller 183 generates timing signals for controlling an operation timing of each of the first touch driver 181 and the second touch driver 182.

The touch coordinates calculator 190 receives the touch raw data (TRD) from the touch driver 180. The touch coordinates calculator 190 calculates the touch coordinates in accordance with a touch coordinates calculation method, and outputs touch coordinates data (HIDxy) including the touch coordinates information to the host system 170.

The touch coordinates calculator 190 may be realized in a micro controller unit (MCU). The host system 170 analyzes the touch coordinates data (HIDxy) which is provided from the touch coordinates calculator 190, and executes an application program linked with the coordinates of a user's touch based on the analyzed data result. The host system 170 transmits the digital video data (DATA) and timing signals to the timing controller 160 in accordance with the executed application program.

The touch driver 180 may be included in the source drive ICs 131, or may be fabricated in an additional driving chip and mounted on the circuit board 150. Also, the touch coordinates calculator 190 may be fabricated in a driving chip and mounted on the circuit board 150.

Figure 3:
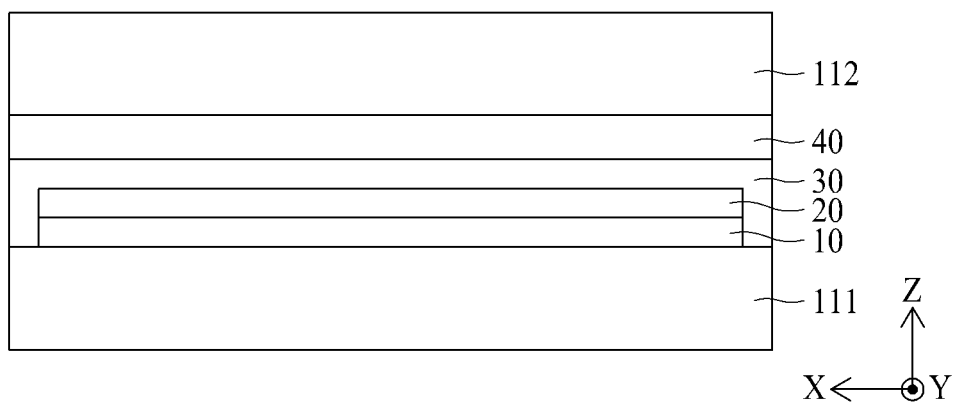
FIG. 3 is a cross sectional view illustrating one lateral side of a display panel according to one embodiment of the present invention.

FIG. 3 is a cross sectional view illustrating one lateral side of the display panel according to one embodiment of the present invention.

Referring to FIG. 3, the display panel 110 may include the first and second substrates 111 and 112, a thin film transistor layer 10 disposed between the first and second substrates 111 and 112, an organic light emitting device layer 20, an encapsulation layer 30, and a touch sensing layer 40.

The first substrate 111 may be a plastic film or a glass substrate.

The thin film transistor layer 10 is formed on the first substrate 111. The thin film transistor layer 10 may include scan lines, data lines, and thin film transistors. Each of the thin film transistors may include a gate electrode, a semiconductor layer, and source and drain electrodes. If the scan driver is formed in a gate driver in panel (GIP) method, the scan driver may be formed together with the thin film transistor layer 10.

The organic light emitting device layer 20 is formed on the thin film transistor layer 10. The organic light emitting device layer 20 may include first electrodes, organic light emitting layers, second electrodes, and banks. Each of the organic light emitting layers may include a hole transporting layer, a light emitting layer, and an electron transporting layer. In this instance, if a voltage is applied to the first and second electrodes, hole and electron are transferred to the light emitting layer through the hole transporting layer and the electron transporting layer, and are then combined in the light emitting layer, to thereby emit light. The pixels are prepared in an area for the organic light emitting device layer 20, and the area for the organic light emitting device layer 20 may be defined as a display area, and a peripheral area of the display panel may be defined as the non-display area.

The encapsulation layer 30 is formed on the organic light emitting device layer 20. The encapsulation layer 30 prevents moisture or oxygen from being permeated into the organic light emitting device layer 20. The encapsulation layer 30 may include at least one inorganic film.

The touch sensing layer 40 is formed on the encapsulation layer 30. The touch sensing layer 40 may include first and second touch electrodes so as to sense a user's touch. A cross sectional and plane structure of the touch sensing layer 40 will be described with reference to FIGS. 4 to 12.

The second substrate 112 is formed on the touch sensing layer 40. The second substrate 112 functions as a cover substrate or a cover window for covering the first substrate 111. The second substrate 112 may be a plastic film, a glass substrate, or an encapsulation film (protection film).

Hereinafter, various examples of the touch sensing layer 40 shown in FIG. 3 will be described with reference to FIGS. 4 to 12.

Figure 4:
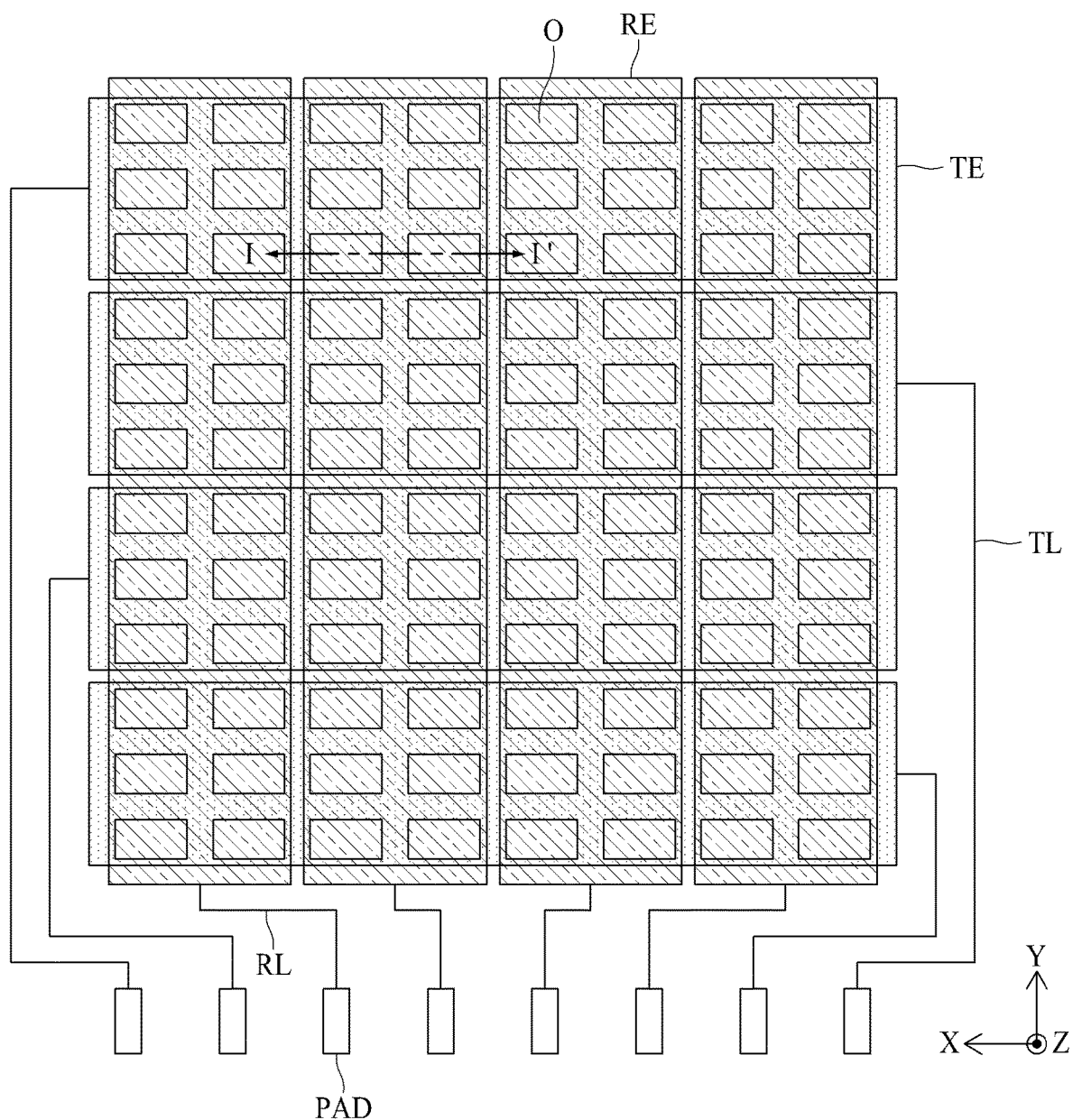
FIG. 4 is a plane view illustrating a first example of a touch sensing layer shown in FIG. 3.

FIG. 4 is a plane view illustrating a first embodiment of the touch sensing layer of FIG. 3.

Referring to FIG. 4, first touch electrodes (TE) extend in a first direction (X-axis direction), and second touch electrodes (RE) extend in a second direction (Y-axis direction). The first direction (X-axis direction) may be parallel to scan lines (S1~Sn) and the second direction (Y-axis direction) may be parallel to data lines (D1~Dm), or the first direction (X-axis direction) may be parallel to the data lines (D1~Dm) and the second direction (Y-axis direction) may be parallel to the scan lines (S1~Sn). The first and second directions intersect, and may be perpendicular.

An opening (O) corresponding to a light-emission area is formed in the first touch electrodes (TE) which extend with a predetermined width in the first direction, wherein an organic light emitting layer 263 emits light in the light-emission area. Accordingly, the first touch electrodes (TE) are formed in a non-emission area, and are not formed in the light-emission area. Meanwhile, the second touch electrodes (RE) which extend with a predetermined width in the second direction are formed not only in the non-emission area but also in the light-emission area.

Meanwhile, an insulating film is disposed between the first touch electrodes (TE) and the second touch electrodes (RE) so that it is possible to electrically insulate the first touch electrodes (TE) from the second touch electrodes (RE). Also, each of the first touch electrodes (TE) extending in the first direction (X-axis direction) is electrically insulated from the first touch electrodes (TE) neighboring in the second direction (Y-axis direction). Each of the second touch electrodes (RE) extending in the second direction (Y-axis direction) is electrically insulated from the second touch electrodes (RE) neighboring in the first direction (X-axis direction).

Accordingly, a mutual capacitance corresponding to a touch sensor may be formed in the intersection of the first and second touch electrodes (TE, RE).

The first touch electrodes (TE) extending in the first direction (X-axis direction) may be connected with a first touch line (TL) at the end of one side. The first touch line (TL) may be connected with a first touch driver 181 through the use of pad (PAD). Accordingly, the first touch electrodes (TE) may receive a driving pulse from the first touch driver 181 through the first touch line (TL).

The second touch electrodes (RE) extending in the second direction (Y-axis direction) may be connected with a second touch line (RL) at the end of one side. The second touch line (RL) may be connected with a second touch driver 182 through the use of pad (PAD). Accordingly, the second touch driver 182 may receive the change of charge amount in the touch sensors of the second touch electrodes (RE).

Figure 5:
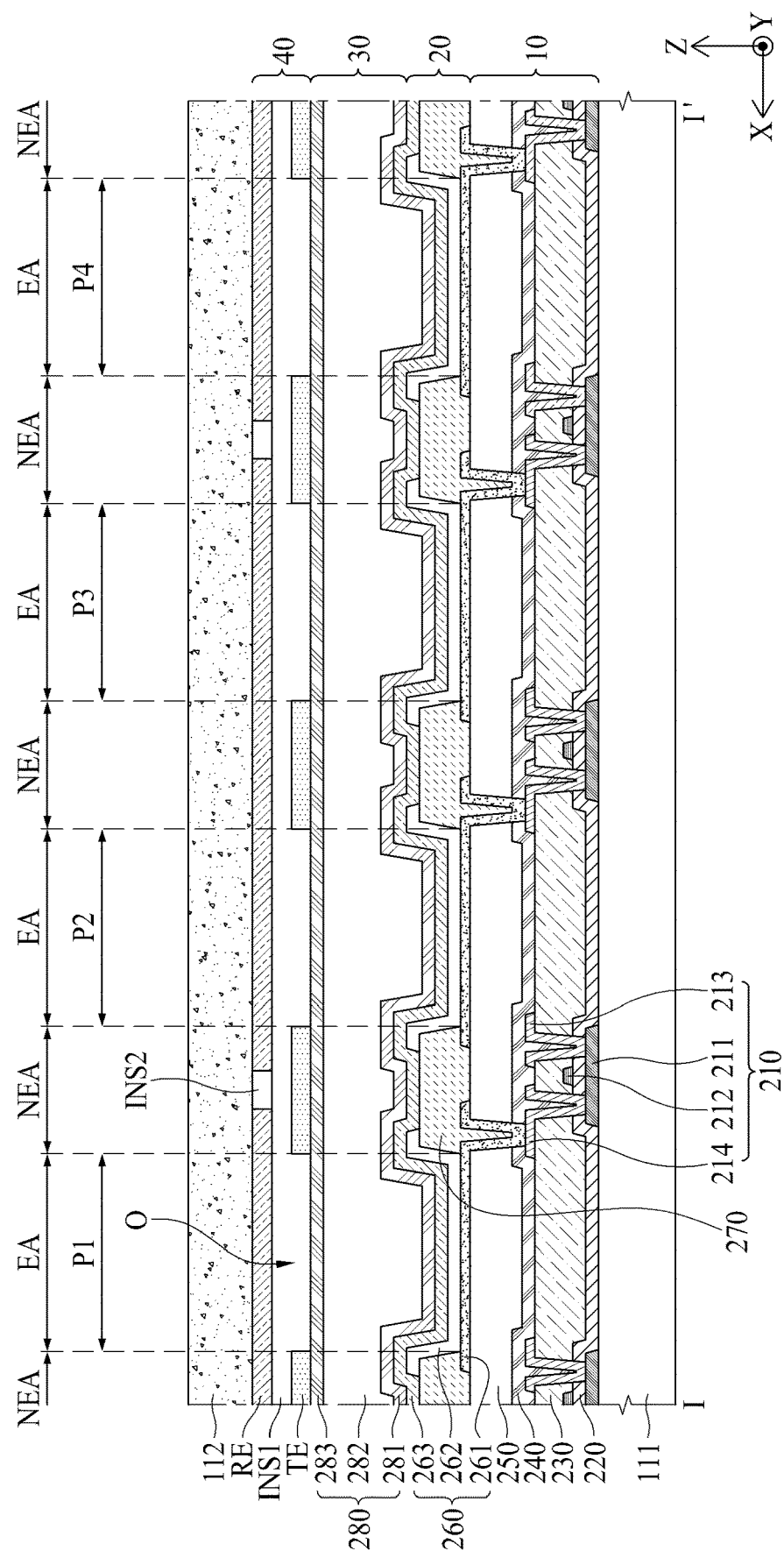
FIG. 5 is a cross sectional view illustrating one example along I-I' of FIG. 4.

FIG. 5 is a cross sectional view illustrating one example along of FIG. 4.

Referring to FIG. 5, a thin film transistor layer 10 is formed on a first substrate 111. The thin film transistor layer 10 includes thin film transistors 210, a gate insulating film 220, an insulating interlayer 230, a protection film 240, and a planarization film 250.

A buffer film is formed on one surface of the first substrate 111. The buffer film is provided on one surface of the first substrate 111 so as to protect the thin film transistors 210 and organic light emitting devices 260 from moisture permeating through the first substrate 111 which is vulnerable to moisture permeability. Herein, one surface of the first substrate 111 may confront a second substrate 112. The buffer film may be formed of a plurality of inorganic films alternately deposited. For example, the buffer film may be formed in a multi-layered structure by alternately depositing at least one inorganic film from a silicon oxide film (SiOx), a silicon nitride film (SiNx), and silicon oxynitride (SiON). It is possible to omit the buffer film in other embodiments.

The thin film transistor 210 is provided on the buffer film. The thin film transistor 210 includes an active layer 211, a gate electrode 212, a source electrode 213, and a drain electrode 214. In FIG. 5, the thin film transistor 210 is provided in a top gate type where the gate electrode 212 is positioned above the active layer 211, but is not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film. The active layer 211 may be formed of a silicon-based semiconductor material or an oxide-based semiconductor material. A light shielding layer may be additionally provided between the buffer film and the active layer 211 so as to block external light being incident on the active layer 211.

The gate insulating film 220 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 and gate line may be provided on the gate insulating film 220. The gate electrode 212 and gate line may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

The insulating interlayer 230 may be provided on the gate electrode 212 and gate line. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

The source electrode 213, the drain electrode 214, and data line may be provided on the insulating interlayer 230. Each of the source electrode 214 and the drain electrode 214 may be connected with the active layer 211 via a contact hole penetrating through the gate insulating film 220 and the insulating interlayer 230. The source electrode 213, the drain electrode 214, and the data line may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

The protection film 240 for an insulation of the thin film transistor 210 may be provided on the source electrode 213, the drain electrode 214, and the data line. The protection film 240 may be formed in a single-layered structure of an inorganic material such as silicon oxide (SiOx) or silicon nitride (SiNx), or a multi-layered structure of the above silicon oxide (SiOx) and silicon nitride (SiNx).

The planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

An organic light emitting device layer 20 is formed on the thin film transistor layer 10, wherein the organic light emitting device layer 20 includes the organic light emitting devices 260 and the bank 270.

The organic light emitting devices 260 and the bank 270 are provided on the planarization film 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be provided on the planarization film 250. The first electrode 261 may be connected with the drain electrode 214 of the thin film transistor 210 via a contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of silver (Ag), palladium (Pd), and copper (Cu).

The bank 270 is provided to cover the edge of the first electrode 261 on the planarization film 250, to thereby divide the pixels (P1, P2, P3, P4). That is, the bank 270 functions as a pixel defining film so as to define the pixels (P1, P2, P3, P4).

The bank 270 may be formed of an organic material, for example, acryl resin, epoxy resin, phenolic resin, polyamide resin, polyimide resin, and etc.

Each of the pixels (P1, P2, P3, P4) indicates a light-emission area, wherein the first electrode 261 corresponding to the anode electrode, the organic light emitting layer, and the second electrode 262 corresponding to the cathode electrode are sequentially deposited in each pixel, and hole and electron are respectively supplied from the first electrode and the second electrode, and are then combined with each other in the organic light emitting layer so as to emit light. That is, each of the pixels (P1, P2, P3, P4) corresponds to the light-emission area (EA). In this instance, the first pixel (P1) may be defined as a red sub pixel, the second pixel (P2) may be defined as a green sub pixel, the third pixel (P3) may be defined as a blue sub pixel, and the fourth sub pixel (P4) may be defined as a white sub pixel. The first, second, third, and fourth pixels (P1, P2, P3, P4) may define one unit pixel. If omitting the white sub pixel, the first, second, and third pixels (P1, P2, P3) may define one unit pixel.

The organic light emitting layer 262 is provided on the first electrode 261 and the bank 270. The organic light emitting layer 262 may include a red emission layer for emitting red light, a green emission layer for emitting green light, a blue emission layer for emitting blue light, and a white emission layer for emitting white light. The red emission layer may be provided on the first electrode 261 of the first pixel (P1), the green emission layer may be provided on the first electrode 261 of the second pixel (P2), the blue emission layer may be provided on the first electrode 261 of the third pixel (P3), and the white emission layer may be provided on the first electrode 261 of the fourth pixel (P4). In this instance, the organic light emitting layer 262 may have a tandem structure of 2 stacks, or more than 2 stacks. Each stack may include a hole transporting layer, at least one light emitting layer, and an electron transporting layer.

The second electrode 263 is provided on the organic light emitting layer 262. The second electrode 263 may cover the organic light emitting layer 262. The second electrode 263 is a common layer provided on the pixels (P1, P2, P3, P4) in common.

The second electrode 263 may be formed of a transparent metal material (transparent conductive material, TCO) capable of transmitting light therethrough, for example, Indium Tin Oxide (ITO) or Indium Zinc Oxide (IZO), or may be formed of a semi-transmissive conductive material such as an alloy of magnesium (Mg) and silver (Ag). If the second electrode 263 is formed of the semi-transmissive material, it is possible to improve a light emission efficiency by a micro cavity. A capping layer may be provided on the second electrode 263.

The encapsulation layer 30 is formed on the organic light emitting device layer 20. The encapsulation layer 30 includes an encapsulation film 280.

The encapsulation film 280 is provided on the second electrode 263. The encapsulation film 280 may prevent a permeation of oxygen or moisture into the organic light emitting layer 262 and the second electrode 263. To this end, the encapsulation film 280 may include at least one inorganic film and at least one organic film. Also, the encapsulation film 280 may include a first inorganic film 281, an organic film 282, and a second inorganic film 283.

The first inorganic film 281 may be disposed on the second electrode 263. The first inorganic film 281 may cover the second electrode 263. The organic film 282 may be disposed on the first inorganic film 281. The organic film 282 may be formed at a thickness enough to prevent particles from getting into the organic light emitting layer 262 and the second electrode 263 through the first inorganic film 281. In this instance, a dam or a barrier is provided to prevent a pad (PAD) from being covered by the organic film 282. The second inorganic film 283 may be disposed on the organic film 282. The second inorganic film 283 may cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, or titanium oxide. The organic film 282 may be formed of acryl resin, epoxy resin, phenolic resin, polyamide resin, polyimide resin, and etc.

A touch sensing layer 40 is provided on the encapsulation layer 30. The touch sensing layer 40 may include the first touch electrodes (TE), the second touch electrodes (RE), and a first insulating film (INS1), and may further include a second insulating film (INS2) according to one embodiment of the present invention.

The first touch electrodes (TE) may be directly formed on an upper surface of the encapsulation layer 30. The first touch electrodes (TE) may extend in the first direction (X-axis direction), and the opening (O) corresponding to the light-emission area (EA) is formed. Accordingly, the first touch electrodes (TE) are not formed in the light-emission area (EA). The first touch electrodes (TE) are formed in the non-emission area (NEA) while being overlapped with the bank 270. Meanwhile, the first touch electrodes (TE) are disposed at fixed intervals along the second direction (Y-axis direction). In this instance, the interval between each of the first touch electrodes (TE) may be smaller than a width of the bank 270 in the second direction. That is, the interval between each of the first touch electrodes (TE) may be smaller than the interval between each of the pixels (P1, P2, P3, P4).

The first touch electrodes (TE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the first touch electrodes (TE) are formed of the reflective metal material so that the first touch electrodes (TE) provide a mirror function as well as a touch function. In more detail, the first touch electrodes (TE) may provide another function in accordance with whether there is the emission of the pixel. If the pixels (P1, P2, P3, P4) emit light, the first touch electrodes (TE) receive the driving pulse from the first touch driver 181 through the first touch lines (TL), whereby they provide the touch function. Meanwhile, if the pixels (P1, P2, P3, P4) do not emit light, the first touch electrodes (TE) reflect the incident light, whereby the first touch electrodes (TE) provide the mirror function.

The first insulating film (INS1) may cover the first touch electrodes (TE). In this instance, the first insulating film (INS1) may be disposed between each of the first touch electrodes (TE). Each of the first touch electrodes (TE) may be electrically insulated from each other by the first insulating film (INS1). Also, the first insulating film (INS1) may be disposed on the first touch electrodes (TE). The first insulating film (INS1) may be formed in a single-layered structure of an inorganic material such as silicon oxide (SiOx) or silicon nitride (SiNx), or a multi-layered structure of the above silicon oxide (SiOx) and silicon nitride (SiNx).

The second touch electrodes (RE) may be provided on the first insulating film (INS1). The second touch electrodes (RE) may extend in the second direction (Y-axis direction). Unlike the first touch electrodes (TE), the opening (O) corresponding to the light-emission area (EA) is not formed in the second touch electrodes (RE). Accordingly, the second touch electrodes (RE) may be formed in the light-emission area (EA) as well as the non-emission area (NEA). Meanwhile, the second touch electrodes (RE) are disposed at fixed intervals along the first direction (X-axis direction). The second touch electrodes (RE) may be formed of a transparent metal material such as ITO or IZO.

The second insulating film (INS2) may cover the second touch electrodes (RE). In this instance, the second insulating film (INS2) may be disposed between each of the second touch electrodes (RE). Each of the second touch electrodes (RE) may be electrically insulated from each other by the second insulating film (INS2). Also, the second insulating film (INS2) may be disposed on the second touch electrodes (RE). The second insulating film (INS2) may be formed in a single-layered structure of an inorganic material such as silicon oxide (SiOx) or silicon nitride (SiNx), or a multi-layered structure of the above silicon oxide (SiOx) and silicon nitride (SiNx). FIG. 5 shows the second insulating film (INS2), but not necessarily. That is, it is possible to omit the second insulating film (INS2).

The first touch line (TL) extends from the first touch electrode (TE), and the second touch line (RL) extends from the second touch electrode (RE). Each of the first and second touch lines (TL, RL) may extend to the non-display area, and may be connected with the pad (PAD) of the non-display area.

Accordingly, as the touch sensing layer 40 is directly formed on the encapsulation layer 30, there is no need to align the first and second substrates 111 and 112 for a bonding process of the first and second substrates 111 and 112. Also, there is no need for an additional adhesive layer so that it is possible to reduce a thickness of the device.

According to the embodiment of the present invention, the first touch electrodes (TE) are formed of the reflective metal material, and the opening (O) corresponding to the light-emission area (EA) is formed in the first touch electrodes (TE), whereby the first touch electrodes (TE) provide the touch function or the mirror function in accordance with whether there is the emission of the pixel. Accordingly, there is no need for an additional reflective film functioning as a mirror so that it is possible to minimize a thickness of the device.

Figure 6:
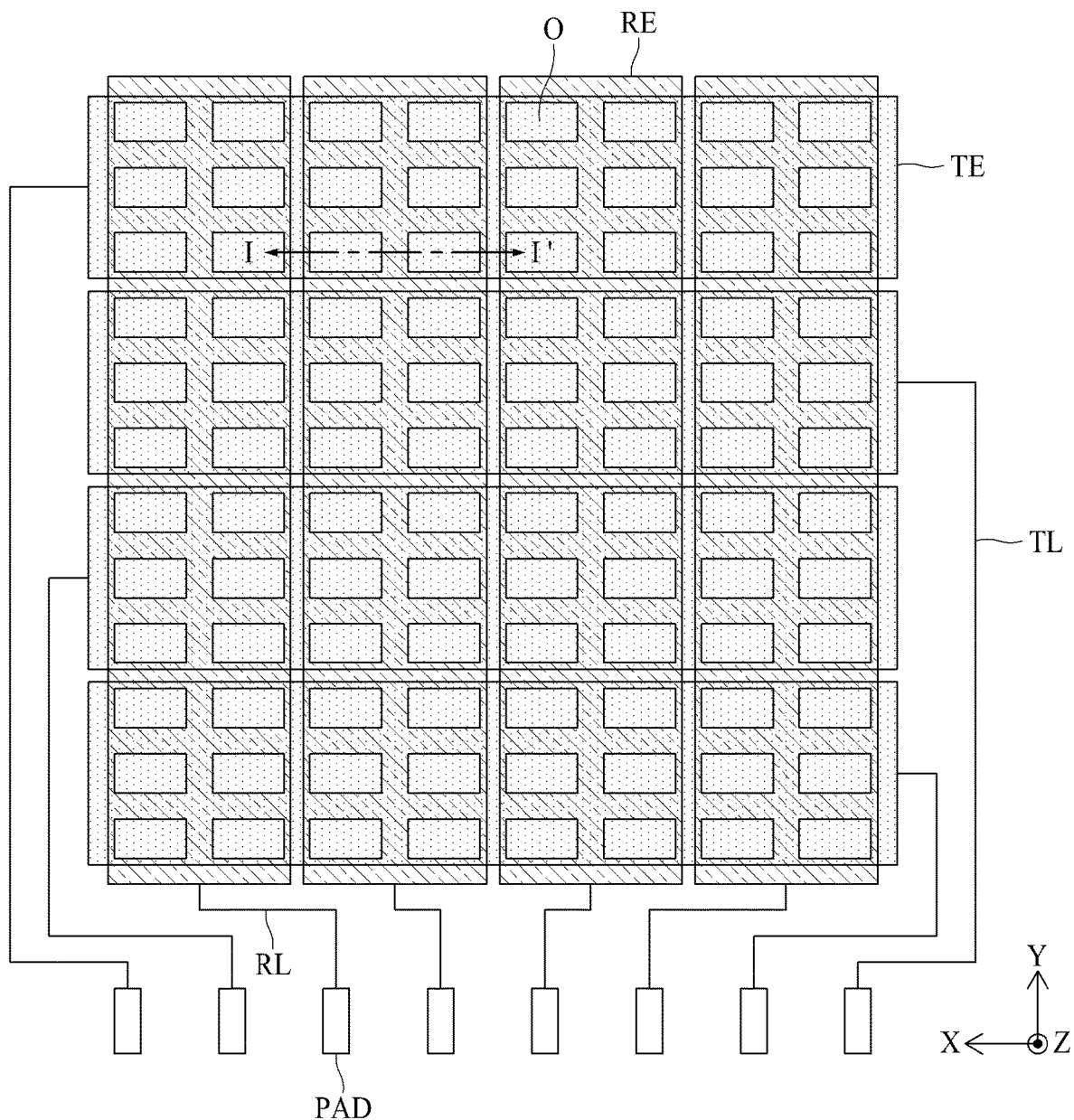
FIG. 6 is a plane view illustrating a second example of a touch sensing layer shown in FIG. 3.

FIG. 6 is a plane view illustrating a second embodiment of the touch sensing layer of FIG. 3.

Referring to FIG. 6, first touch electrodes (TE) extend in a first direction (X-axis direction), and second touch electrodes (RE) extend in a second direction (Y-axis direction). The first direction (X-axis direction) may be parallel to scan lines (S1~Sn) and the second direction (Y-axis direction) may be parallel to data lines (D1~Dm), or the first direction (X-axis direction) may be parallel to the data lines (D1~Dm) and the second direction (Y-axis direction) may be parallel to the scan lines (S1~Sn).

An opening (O) corresponding to a light-emission area is formed in the second touch electrodes (RE) which extend with a predetermined width in the second direction, wherein an organic light emitting layer 262 emits light in the light-emission area. Accordingly, the second touch electrodes (RE) are formed in a non-emission area, and are not formed in the light-emission area. Meanwhile, the first touch electrodes (TE) which extend with a predetermined width in the first direction are formed not only in the non-emission area but also in the light-emission area.

Meanwhile, an insulating film is disposed between the first touch electrodes (TE) and the second touch electrodes (RE) so that it is possible to electrically insulate the first touch electrodes (TE) from the second touch electrodes (RE). Also, each of the first touch electrodes (TE) extending in the first direction (X-axis direction) is electrically insulated from the first touch electrodes (TE) neighboring in the second direction (Y-axis direction). Each of the second touch electrodes (RE) extending in the second direction (Y-axis direction) is electrically insulated from the second touch electrodes (RE) neighboring in the first direction (X-axis direction).

Accordingly, a mutual capacitance corresponding to a touch sensor may be formed in the intersection of the first and second touch electrodes (TE, RE).

The first touch electrodes (TE) extending in the first direction (X-axis direction) may be connected with a first touch line (TL) at the end of one side. The first touch line (TL) may be connected with a first touch driver 181 through the use of pad (PAD). Accordingly, the first touch electrodes (TE) may receive a driving pulse from the first touch driver 181 through the first touch line (TL).

The second touch electrodes (RE) extending in the second direction (Y-axis direction) may be connected with a second touch line (RL) at the end of one side. The second touch line (RL) may be connected with a second touch driver 182 through the use of pad (PAD). Accordingly, the second touch driver 182 may receive the change of charge amount in the touch sensors of the second touch electrodes (RE).

Figure 7:
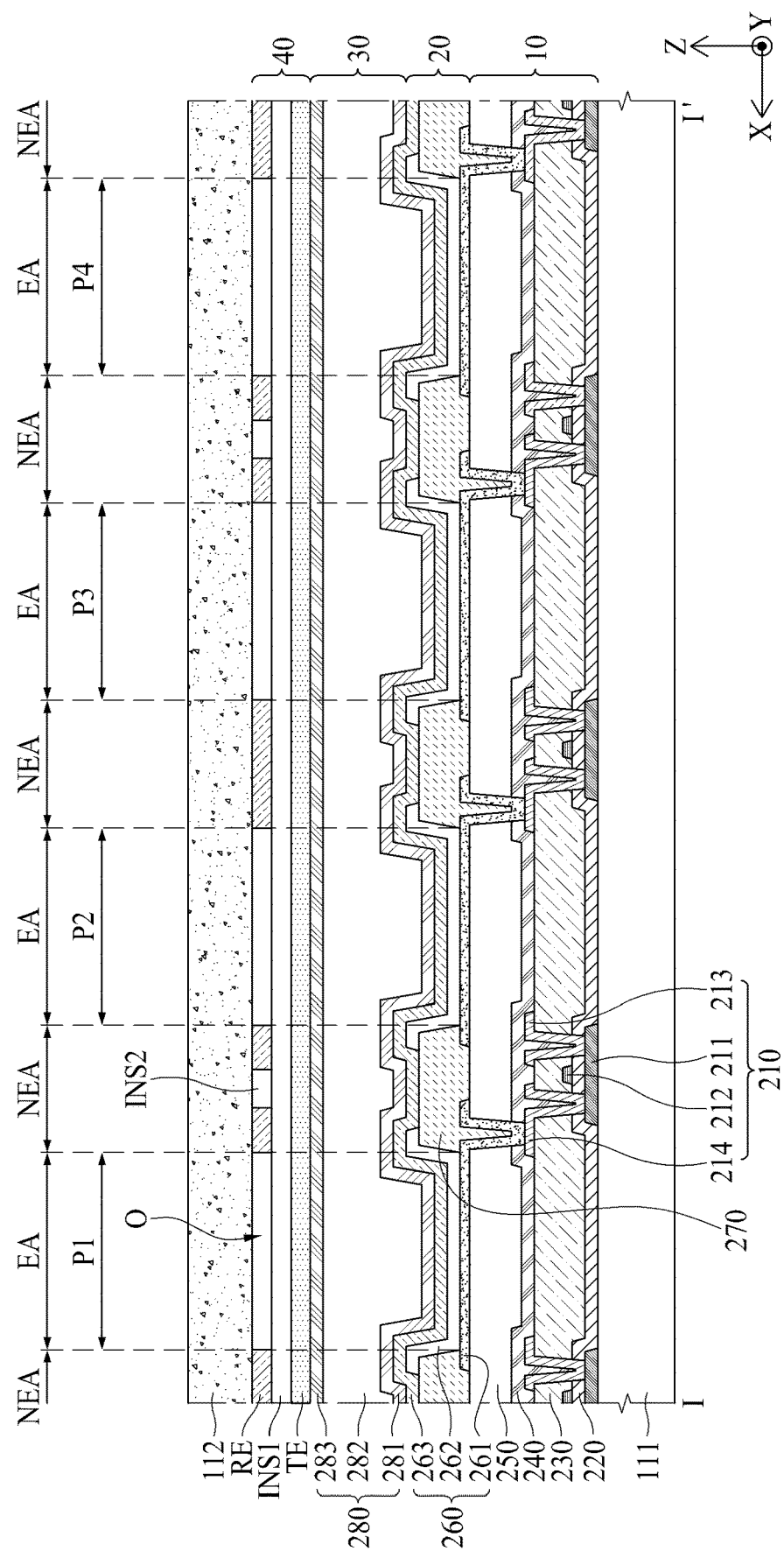
FIG. 7 is a cross sectional view illustrating one example along I-I' of FIG. 6.

FIG. 7 is a cross sectional view illustrating one example along of FIG. 6.

A thin film transistor layer 10, an organic light emitting device layer 20, and an encapsulation layer 30 shown in FIG. 7 are the same as those of FIG. 5, whereby a detailed description for the thin film transistor layer 10, the organic light emitting device layer 20, and the encapsulation layer 30 will be omitted.

A touch sensing layer 40 is formed on the encapsulation layer 30. The touch sensing layer 40 may include the first touch electrode (TE), the second touch electrodes (RE), and a first insulating film (INS1), and may further include a second insulating film (INS2) according to one embodiment of the present invention.

The first touch electrodes (TE) may be directly formed on an upper surface of the encapsulation layer 30. The first touch electrodes (TE) may extend in the first direction (X-axis direction). The first touch electrodes (TE) are formed not only in the non-emission area (NEA) but also in the light-emission area (EA). Meanwhile, the first touch electrodes (TE) are disposed at fixed intervals along the second direction (Y-axis direction). The first touch electrodes (TE) may be formed of a transparent metal material such as ITO or IZO.

The first insulating film (INS1) may cover the first touch electrodes (TE). In this instance, the first insulating film (INS1) may be disposed between each of the first touch electrodes (TE). Each of the first touch electrodes (TE) may be electrically insulated from each other by the first insulating film (INS1). Also, the first insulating film (INS1) may be disposed on the first touch electrodes (TE). The first insulating film (INS1) may be formed in a single-layered structure of an inorganic material such as silicon oxide (SiOx) or silicon nitride (SiNx), or a multi-layered structure of the above silicon oxide (SiOx) and silicon nitride (SiNx).

The second touch electrodes (RE) may be provided on the first insulating film (INS1). The second touch electrodes (RE) may extend in the second direction (Y-axis direction). Unlike the first touch electrodes (TE), the opening (O) corresponding to the light-emission area (EA) is formed in the second touch electrodes (RE). Accordingly, the second touch electrodes (RE) are not formed in the light-emission area (EA). The second touch electrodes (RE) are formed in the non-emission area (NEA) while being overlapped with the bank 270. Meanwhile, the second touch electrodes (RE) are disposed at fixed intervals along the first direction (X-axis direction). In this instance, the interval between each of the second touch electrodes (RE) may be smaller than a width of the bank 270 in the first direction. That is, the interval between each of the second touch electrodes (RE) may be smaller than the interval between each of the pixels (P1, P2, P3, P4).

The second touch electrodes (RE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the second touch electrodes (RE) are formed of the reflective metal material so that the second touch electrodes (RE) provide a mirror function as well as a touch function. In more detail, the second touch electrodes (RE) may provide another function in accordance with whether there is the emission of the pixel. If the pixels (P1, P2, P3, P4) emit light, the second touch electrodes (RE) provide the change of charge amount in the touch sensors to the second touch driver 182 through the second touch lines (RL), whereby they provide the touch function. Meanwhile, if the pixels (P1, P2, P3, P4) do not emit light, the second touch electrodes (RE) reflect the incident light, whereby they provide the mirror function.

The second insulating film (INS2) may cover the second touch electrodes (RE). In this instance, the second insulating film (INS2) may be disposed between each of the second touch electrodes (RE). Each of the second touch electrodes (RE) may be electrically insulated from each other by the second insulating film (INS2). Also, the second insulating film (INS2) may be disposed on the second touch electrodes (RE). The second insulating film (INS2) may be formed in a single-layered structure of an inorganic material such as silicon oxide (SiOx) or silicon nitride (SiNx), or a multi-layered structure of the above silicon oxide (SiOx) and silicon nitride (SiNx). FIG. 7 shows the second insulating film (INS2), but not necessarily. That is, it is possible to omit the second insulating film (INS2).

The first touch line (TL) extends from the first touch electrode (TE), and the second touch line (RL) extends from the second touch electrode (RE). Each of the first and second touch lines (TL, RL) may extend to the non-display area, and may be connected with the pad (PAD) of the non-display area.

Accordingly, as the touch sensing layer 40 is directly formed on the encapsulation layer 30, there is no need to align the first and second substrates 111 and 112 for a bonding process of the first and second substrates 111 and 112. Also, there is no need for an additional adhesive layer so that it is possible to reduce a thickness of the device.

According to the embodiment of the present invention, the second touch electrodes (RE) are formed of the reflective metal material, and the opening (O) corresponding to the light-emission area (EA) is formed in the second touch electrodes (RE), whereby the second touch electrodes (RE) provide the touch function or the mirror function in accordance with whether there is the emission of the pixel. Accordingly, there is no need for an additional reflective film functioning as a mirror so that it is possible to minimize a thickness of the device.

Figure 8:
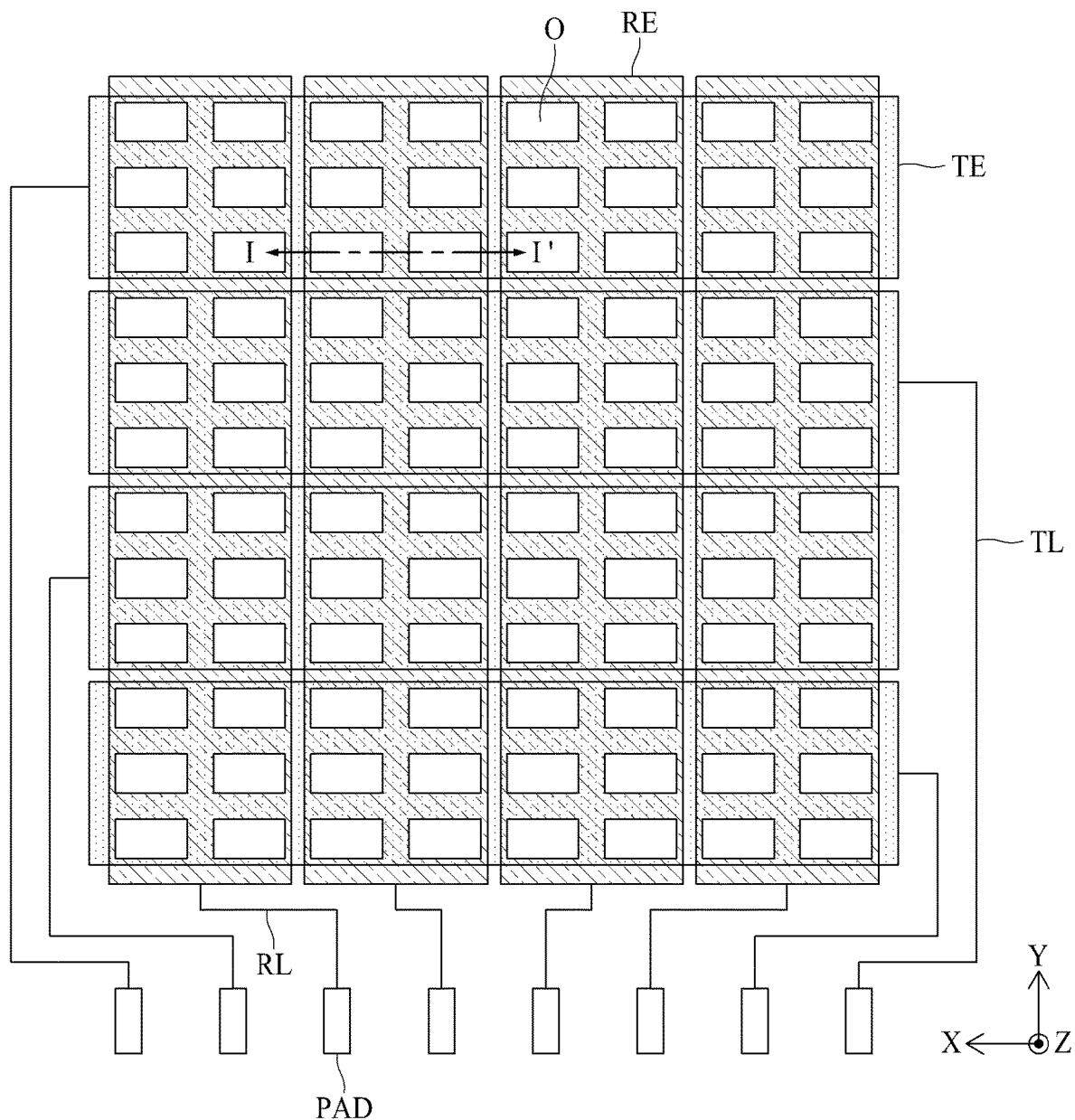
FIG. 8 is a plane view illustrating a third example of a touch sensing layer shown in FIG. 3.

FIG. 8 is a plane view illustrating a third embodiment of the touch sensing layer of FIG. 3.

Referring to FIG. 8, first touch electrodes (TE) extend in a first direction (X-axis direction), and second touch electrodes (RE) extend in a second direction (Y-axis direction). The first direction (X-axis direction) may be parallel to scan lines (S1~Sn) and the second direction (Y-axis direction) may be parallel to data lines (D1~Dm), or the first direction (X-axis direction) may be parallel to the data lines (D1~Dm) and the second direction (Y-axis direction) may be parallel to the scan lines (S1~Sn).

An opening (O) corresponding to a light-emission area is formed in the first touch electrodes (TE) which extend with a predetermined width in the first direction, wherein an organic light emitting layer 262 emits light in the light-emission area. Accordingly, the first touch electrodes (TE) are formed in a non-emission area, and are not formed in the light-emission area. Also, an opening (O) corresponding the light-emission area is formed in the second touch electrodes (RE) which extend with a predetermined width in the second direction, wherein the organic light emitting layer 262 emits light in the light-emission area. Accordingly, the second touch electrodes (RE) are formed in the non-emission area, and are not formed in the light-emission area.

Meanwhile, an insulating film is disposed between the first touch electrodes (TE) and the second touch electrodes (RE) so that it is possible to electrically insulate the first touch electrodes (TE) from the second touch electrodes (RE). Also, each of the first touch electrodes (TE) extending in the first direction (X-axis direction) is electrically insulated from the first touch electrodes (TE) neighboring in the second direction (Y-axis direction). Each of the second touch electrodes (RE) extending in the second direction (Y-axis direction) is electrically insulated from the second touch electrodes (RE) neighboring in the first direction (X-axis direction).

Accordingly, a mutual capacitance corresponding to a touch sensor may be formed in the intersection of the first and second touch electrodes (TE, RE).

The first touch electrodes (TE) extending in the first direction (X-axis direction) may be connected with a first touch line (TL) at the end of one side. The first touch line (TL) may be connected with a first touch driver 181 through the use of pad (PAD). Accordingly, the first touch electrodes (TE) may receive a driving pulse from the first touch driver 181 through the first touch line (TL).

The second touch electrodes (RE) extending in the second direction (Y-axis direction) may be connected with a second touch line (RL) at the end of one side. The second touch line (RL) may be connected with a second touch driver 182 through the use of pad (PAD). Accordingly, the second touch driver 182 may receive the change of charge amount in the touch sensors of the second touch electrodes (RE).

Figure 9:
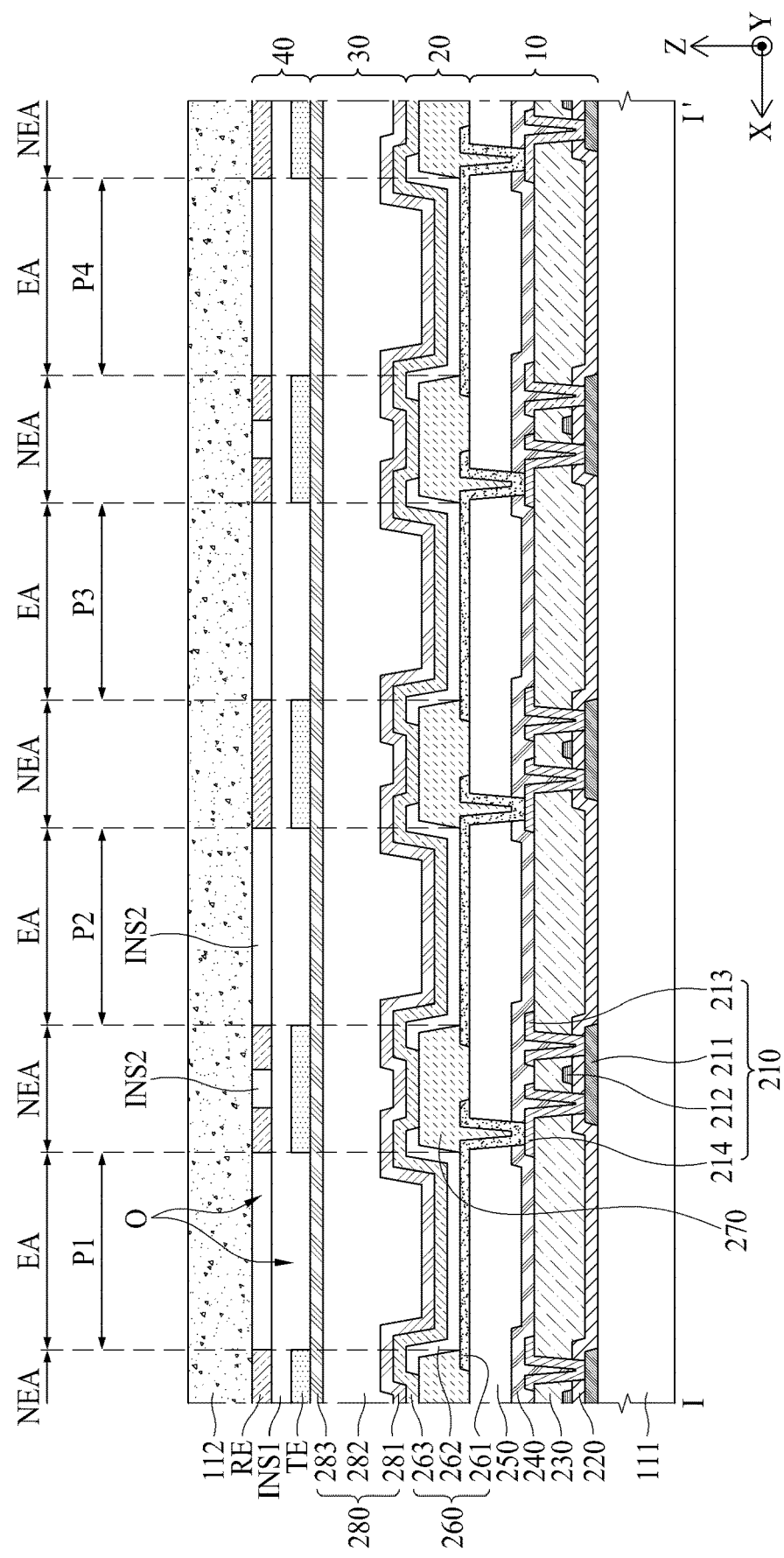
FIG. 9 is a cross sectional view illustrating one example along I-I' of FIG. 8.

FIG. 9 is a cross sectional view illustrating one example along I-I' of FIG. 8.

A thin film transistor layer 10, an organic light emitting device layer 20, and an encapsulation layer 30 shown in FIG. 9 are the same as those of FIG. 5, whereby a detailed description for the thin film transistor layer 10, the organic light emitting device layer 20, and the encapsulation layer 30 will be omitted.

A touch sensing layer 40 is formed on the encapsulation layer 30. The touch sensing layer 40 may include the first touch electrode (TE), the second touch electrodes (RE), and a first insulating film (INS1), and may further include a second insulating film (INS2) according to one embodiment of the present invention.

The first touch electrodes (TE) may be directly formed on an upper surface of the encapsulation layer 30. The first touch electrodes (TE) may extend in the first direction (X-axis direction), and the opening (O) corresponding to the light-emission area (EA) is formed. Accordingly, the first touch electrodes (TE) are not formed in the light-emission area (EA). The first touch electrodes (TE) are formed in the non-emission area (NEA) while being overlapped with the bank 270. Meanwhile, the first touch electrodes (TE) are disposed at fixed intervals along the second direction (Y-axis direction). In this instance, the interval between each of the first touch electrodes (TE) may be smaller than a width of the bank 270 in the second direction. That is, the interval between each of the first touch electrodes (TE) may be smaller than the interval between each of the pixels (P1, P2, P3, P4).

The first touch electrodes (TE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the first touch electrodes (TE) are formed of the reflective metal material so that the first touch electrodes (TE) provide a mirror function as well as a touch function. In more detail, the first touch electrodes (TE) may provide another function in accordance with whether there is the emission of the pixel. If the pixels (P1, P2, P3, P4) emit light, the first touch electrodes (TE) receive the driving pulse from the first touch driver 181 through the first touch lines (TL), whereby they provide the touch function. Meanwhile, if the pixels (P1, P2, P3, P4) do not emit light, the first touch electrodes (TE) reflect the incident light, whereby the first touch electrodes (TE) provide the mirror function.

The first insulating film (INS1) may cover the first touch electrodes (TE). In this instance, the first insulating film (INS1) may be disposed between each of the first touch electrodes (TE). Each of the first touch electrodes (TE) may be electrically insulated from each other by the first insulating film (INS1). Also, the first insulating film (INS1) may be disposed on the first touch electrodes (TE). The first insulating film (INS1) may be formed in a single-layered structure of an inorganic material such as silicon oxide (SiOx) or silicon nitride (SiNx), or a multi-layered structure of the above silicon oxide (SiOx) and silicon nitride (SiNx).

The second touch electrodes (RE) may be provided on the first insulating film (INS1). The second touch electrodes (RE) may extend in the second direction (Y-axis direction). In the same manner as the first touch electrodes (TE), the opening (O) corresponding to the light-emission area (EA) is formed in the second touch electrodes (RE). Accordingly, the second touch electrodes (RE) are not formed in the light-emission area (EA). The second touch electrodes (RE) are formed in the non-emission area (NEA) while being overlapped with the bank 270. Meanwhile, the second touch electrodes (RE) are disposed at fixed intervals along the first direction (X-axis direction). In this instance, the interval between each of the second touch electrodes (RE) may be smaller than a width of the bank 270 in the first direction. That is, the interval between each of the second touch electrodes (RE) may be smaller than the interval between each of the pixels (P1, P2, P3, P4).

The second touch electrodes (RE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the second touch electrodes (RE) are formed of the reflective metal material so that the second touch electrodes (RE) provide a mirror function as well as a touch function. In more detail, the second touch electrodes (RE) may provide another function in accordance with whether there is the emission of the pixel. If the pixels (P1, P2, P3, P4) emit light, the second touch electrodes (RE) provide the change of charge amount in the touch sensors to the second touch driver 182 through the second touch lines (RL), whereby they provide the touch function. Meanwhile, if the pixels (P1, P2, P3, P4) do not emit light, the second touch electrodes (RE) reflect the incident light, whereby they provide the mirror function.

The second insulating film (INS2) may cover the second touch electrodes (RE). In this instance, the second insulating film (INS2) may be disposed between each of the second touch electrodes (RE). Each of the second touch electrodes (RE) may be electrically insulated from each other by the second insulating film (INS2). Also, the second insulating film (INS2) may be disposed on the second touch electrodes (RE). The second insulating film (INS2) may be formed in a single-layered structure of an inorganic material such as silicon oxide (SiOx) or silicon nitride (SiNx), or a multi-layered structure of the above silicon oxide (SiOx) and silicon nitride (SiNx). FIG. 9 shows the second insulating film (INS2), but not necessarily. That is, it is possible to omit the second insulating film (INS2).

The first touch line (TL) extends from the first touch electrode (TE), and the second touch line (RL) extends from the second touch electrode (RE). Each of the first and second touch lines (TL, RL) may extend to the non-display area, and may be connected with the pad (PAD) of the non-display area.

Accordingly, as the touch sensing layer 40 is directly formed on the encapsulation layer 30, there is no need to align the first and second substrates 111 and 112 for a bonding process of the first and second substrates 111 and 112. Also, there is no need for an additional adhesive layer so that it is possible to reduce a thickness of the device.

According to the embodiment of the present invention, the first and second touch electrodes (TE, RE) are formed of the reflective metal material, and the opening (O) corresponding to the light-emission area (EA) is formed in the first and second touch electrodes (TE, RE), whereby the first and second touch electrodes (TE, RE) provide the touch function or the mirror function in accordance with whether there is the emission of the pixel. Accordingly, there is no need for an additional reflective film functioning as a mirror so that it is possible to minimize a thickness of the device.

Figure 10:
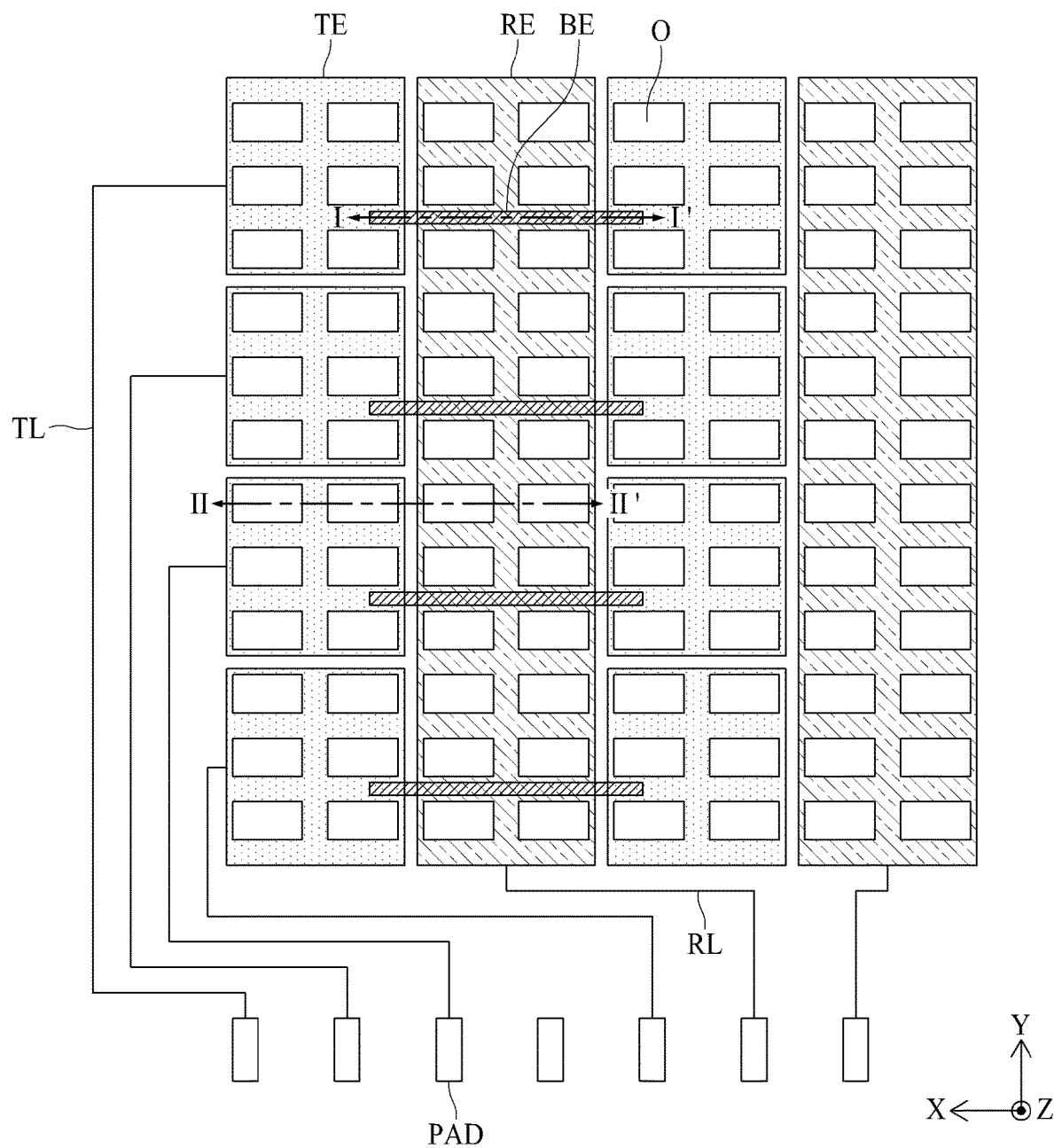
FIG. 10 is a plane view illustrating a fourth example of a touch sensing layer shown in FIG. 3.

FIG. 10 is a plane view illustrating a fourth embodiment of the touch sensing layer of FIG. 3.

Referring to FIG. 10, first touch electrodes (TE) extend in a first direction (X-axis direction), and second touch electrodes (RE) extend in a second direction (Y-axis direction). The first direction (X-axis direction) may be parallel to scan lines (S1~Sn) and the second direction (Y-axis direction) may be parallel to data lines (D1~Dm), or the first direction (X-axis direction) may be parallel to the data lines (D1~Dm) and the second direction (Y-axis direction) may be parallel to the scan lines (S1~Sn).

An opening (O) corresponding to a light-emission area is formed in the first touch electrodes (TE) which are connected with one another in the first direction, wherein an organic light emitting layer 262 emits light in the light-emission area. Accordingly, the first touch electrodes (TE) are formed in a non-emission area, and are not formed in the light-emission area. Also, an opening (O) corresponding the light-emission area is formed in the second touch electrodes (RE) which extend in the second direction, wherein the organic light emitting layer 262 emits light in the light-emission area. Accordingly, the second touch electrodes (RE) are formed in the non-emission area, and are not formed in the light-emission area.

Meanwhile, in order to prevent a disconnection at respective intersections of the first touch electrodes (TE) and the second touch electrodes (RE), the first touch electrodes (TE) which neighbor in the first direction (X-axis direction) may be electrically connected with each other through the use of bridge electrode (BE). The bridge electrode (BE) is disposed in the different layer from the first and second touch electrodes (TE, RE), and the bridge electrode (BE) may be connected with the neighboring first touch electrodes (TE) through a contact portion (CT). The bridge electrode (BE) may intersect the second touch electrode (RE).

Each of the first touch electrodes (TE) connected in the first direction (X-axis direction) is electrically insulated from the first touch electrodes (TE) neighboring in the second direction (Y-axis direction). Each of the second touch electrodes (RE) extending in the second direction (Y-axis direction) is electrically insulated from the second touch electrodes (RE) neighboring in the first direction (X-axis direction).

Accordingly, a mutual capacitance corresponding to a touch sensor may be formed in the intersection of the first and second touch electrodes (TE, RE).

The first touch electrodes (TE) extending in the first direction (X-axis direction) may be connected with a first touch line (TL) at the end of one side. The first touch line (TL) may be connected with a first touch driver 181 through the use of pad (PAD). Accordingly, the first touch electrodes (TE) may receive a driving pulse from the first touch driver 181 through the first touch line (TL).

The second touch electrodes (RE) extending in the second direction (Y-axis direction) may be connected with a second touch line (RL) at the end of one side. The second touch line (RL) may be connected with a second touch driver 182 through the use of pad (PAD). Accordingly, the first touch driver 182 may receive the change of charge amount in the touch sensors of the second touch electrodes (RE).

Figure 11:
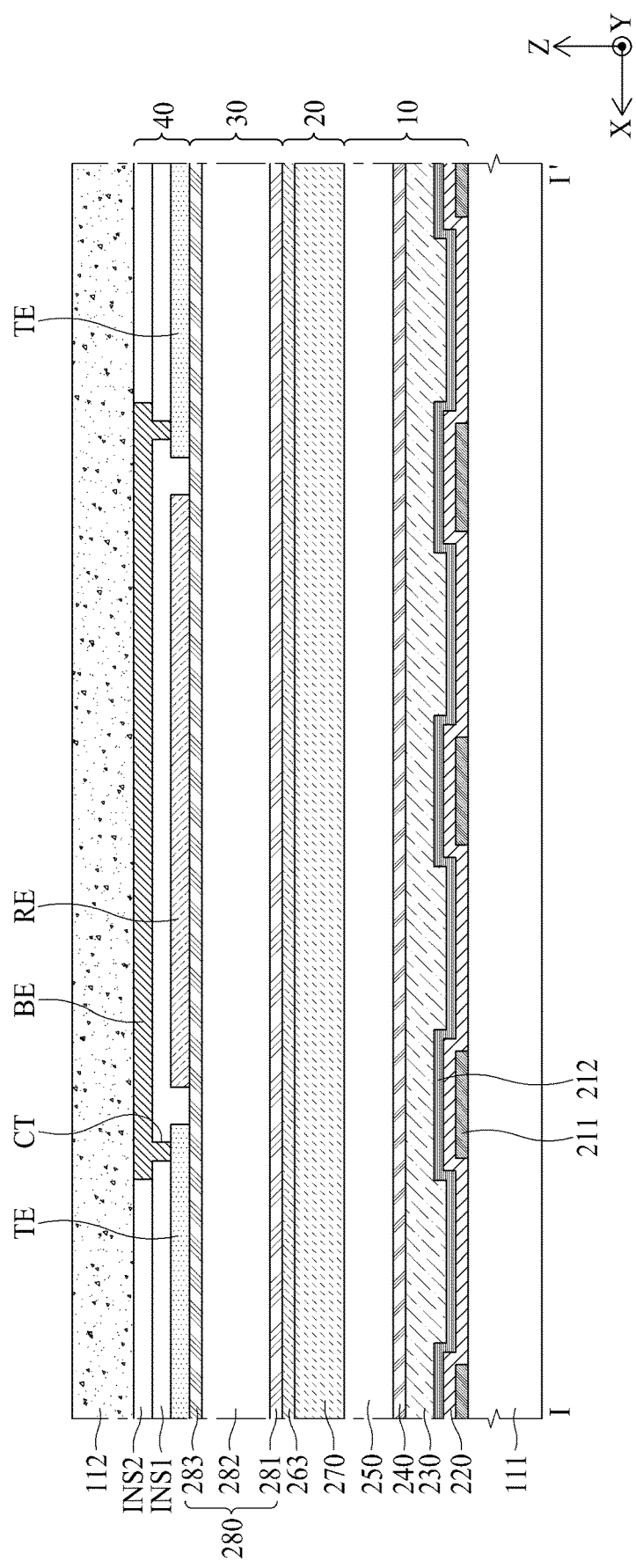
FIG. 11 is a cross sectional view illustrating one example along I-I' of FIG. 10.
Figure 12:
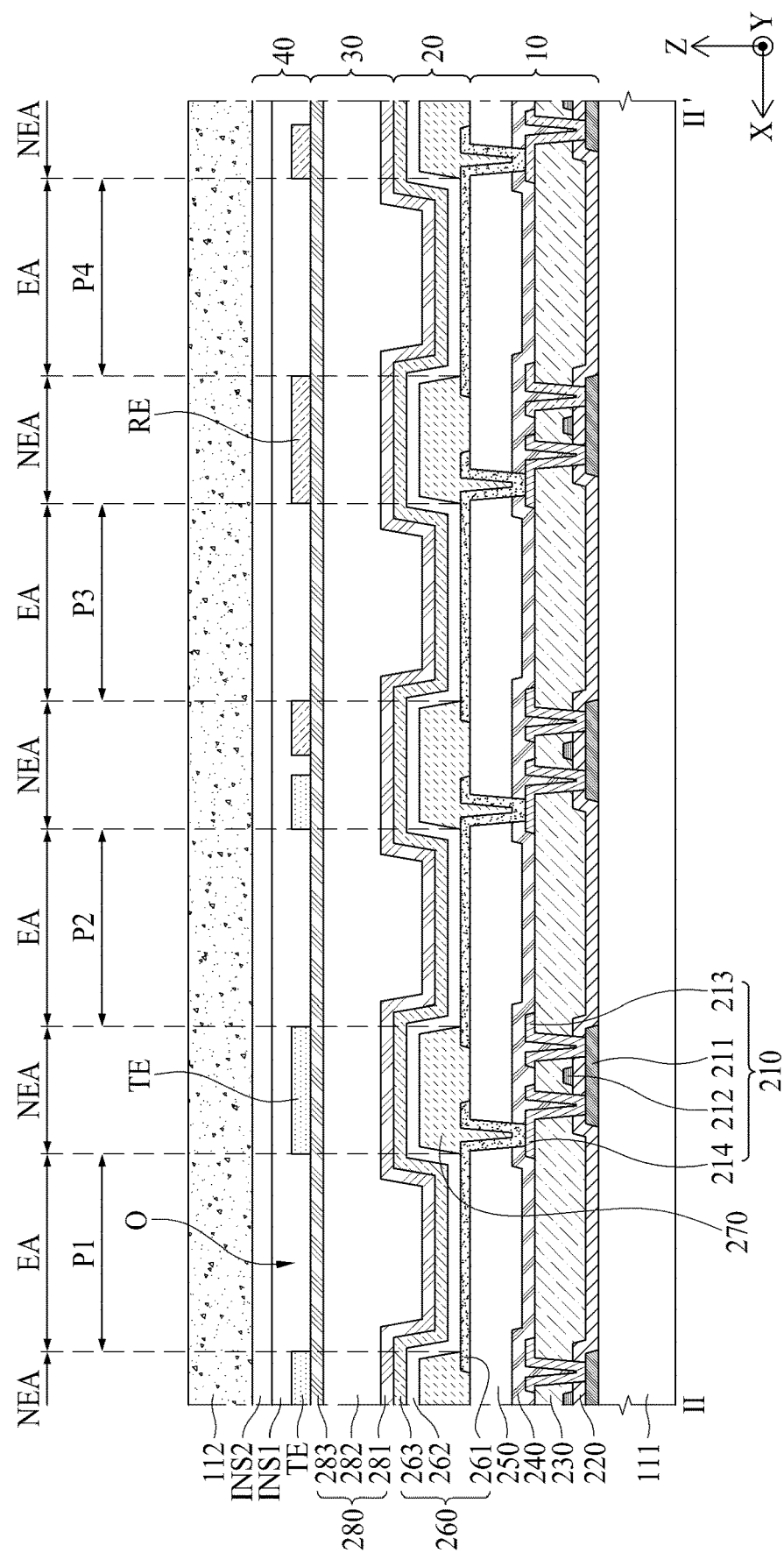
FIG. 12 is a cross sectional view illustrating one example along II-IP of FIG. 10.

FIG. 11 is a cross sectional view illustrating one example along I-I' of FIG. 10. FIG. 12 is a cross sectional view illustrating one example along II-II' of FIG. 10.

A thin film transistor layer 10, an organic light emitting device layer 20, and an encapsulation layer 30 shown in FIGS. 11 and 12 are the same as those of FIG. 5, whereby a detailed description for the thin film transistor layer 10, the organic light emitting device layer 20, and the encapsulation layer 30 will be omitted.

Referring to FIGS. 11 and 12, a touch sensing layer 40 is formed on the encapsulation layer 30. The touch sensing layer 40 may include the first touch electrode (TE), the second touch electrodes (RE), and a first insulating film (INS1), and may further include a second insulating film (INS2) according to one embodiment of the present invention.

The first touch electrodes (TE) and second touch electrodes (RE) may be directly formed on an upper surface of the encapsulation layer 30. The first touch electrodes (TE) are arranged in the first direction (X-axis direction), and are electrically connected with one another by the bridge electrode (BE). The opening (O) corresponding to the light-emission area (EA) is formed in the first touch electrodes (TE). Accordingly, the first touch electrodes (TE) are not formed in the light-emission area (EA). The first touch electrodes (TE) are formed in the non-emission area (NEA) while being overlapped with the bank 270. Meanwhile, the first touch electrodes (TE) are arranged at fixed intervals along the second direction (Y-axis direction). In this instance, the interval between each of the first touch electrodes (TE) may be smaller than a width of the bank 270 in the second direction. That is, the interval between each of the first touch electrodes (TE) may be smaller than the interval between each of the pixels (P1, P2, P3, P4).

The first touch electrodes (TE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the first touch electrodes (TE) are formed of the reflective metal material so that the first touch electrodes (TE) provide a mirror function as well as a touch function. In more detail, the first touch electrodes (TE) may provide another function in accordance with whether there is the emission of the pixel. If the pixels (P1, P2, P3, P4) emit light, the first touch electrodes (TE) receive the driving pulse from the first touch driver 181 through the first touch lines (TL), whereby they provide the touch function. Meanwhile, if the pixels (P1, P2, P3, P4) do not emit light, the first touch electrodes (TE) reflect the incident light, whereby they provide the mirror function.

The second touch electrodes (RE) extend in the second direction (Y-axis direction), and the opening (O) corresponding to the light-emission area (EA) is formed in the second touch electrodes (RE). Accordingly, the second touch electrodes (RE) are not formed in the light-emission area (EA). The second touch electrodes (RE) are formed in the non-emission area (NEA) while being overlapped with the bank 270. Meanwhile, the second touch electrodes (RE) are arranged at fixed intervals along the first direction (X-axis direction). In this instance, the interval between each of the second touch electrodes (RE) may be smaller than a width of the bank 270 in the first direction. That is, the interval between each of the second touch electrodes (RE) may be smaller than the interval between each of the pixels (P1, P2, P3, P4).

The second touch electrodes (RE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the second touch electrodes (RE) are formed of the reflective metal material so that the second touch electrodes (RE) provide a mirror function as well as a touch function. In more detail, the second touch electrodes (RE) may provide another function in accordance with whether there is the emission of the pixel. If the pixels (P1, P2, P3, P4) emit light, the second touch electrodes (RE) provide the change of charge amount in the touch sensors to the second touch driver 182 through the second touch lines (RL), whereby they provide the touch function. Meanwhile, if the pixels (P1, P2, P3, P4) do not emit light, the second touch electrodes (RE) reflect the incident light, whereby they provide the mirror function.

The first insulating film (INS1) may cover the first touch electrodes (TE) and second touch electrodes (RE). The first insulating film (INS1) may be disposed between each of the first touch electrodes (TE) and each of the second touch electrodes (RE). Each of the first touch electrodes (TE) may be insulated from each of the second touch electrodes (RE) by the first insulating film (INS1). Also, the first insulating film (INS1) may be disposed between each of the second touch electrodes (RE) and each of the bridge electrodes (BE). Each of the second touch electrodes (RE) may be insulated from each of the bridge electrodes (BE) by the first insulating film (INS1).

The bridge electrodes (BE) are formed on the first insulating film (INS1). In order to prevent the disconnection at the intersection of the first touch electrodes (TE) and the second touch electrodes (RE), the first touch electrodes (TE) which neighbor in the first direction (X-axis direction) may be electrically connected with each other through the use of bridge electrode (BE). The bridge electrode (BE) is disposed in the different layer from the first and second touch electrodes (TE, RE), and the bridge electrode (BE) may be connected with the neighboring first touch electrodes (TE) through the contact portion (CT). The bridge electrode (BE) may intersect the second touch electrode (RE).

In this instance, the contact holes (CT) may penetrate through the first insulating film (INS1). Accordingly, as the bridge electrode (BE) is formed in the first insulating film (INS1), the bridge electrode (BE) is connected with the adjacent two of first touch electrodes (TE) through the two contact holes (CT) for exposing the adjacent two of first touch electrodes (TE), to thereby electrically connect the adjacent two of first touch electrodes (TE) with each other. Meanwhile, the bridge electrode (BE) is disposed in the non-emission area (NEA) while being overlapped with the bank 270.

The bridge electrodes (BE) and the second insulating film (INS2) may be disposed in the same layer. That is, the second insulating film (INS2) may be disposed between each of the bridge electrodes (BE). The bridge electrodes (BE) may be electrically insulated from one another by the second insulating film (INS2).

The first touch line (TL) extends from the first touch electrode (TE), and the second touch line (RL) extends from the second touch electrode (RE). Each of the first and second touch lines (TL, RL) may extend to the non-display area, and may be connected with the pad (PAD) of the non-display area.

Accordingly, as the touch sensing layer 40 is directly formed on the encapsulation layer 30, there is no need to align the first and second substrates 111 and 112 for a bonding process of the first and second substrates 111 and 112. Also, there is no need for an additional adhesive layer so that it is possible to reduce a thickness of the device.

According to the embodiment of the present invention, the first and second touch electrodes (TE, RE) are formed of the reflective metal material, and the opening (O) corresponding to the light-emission area (EA) is formed in the first and second touch electrodes (TE, RE), whereby the first and second touch electrodes (TE, RE) provide the touch function or the mirror function in accordance with whether there is the emission of the pixel. Accordingly, there is no need for an additional reflective film functioning as a mirror so that it is possible to minimize a thickness of the device.

In FIGS. 3 to 12, the organic light emitting layer 262 of the organic light emitting device 260 includes the red emission layer for emitting red light, the green emission layer for emitting green light, the blue emission layer for emitting blue light, and the white emission layer for emitting white light, but is not limited to this structure. For example, the organic light emitting layer 262 of the organic light emitting device 260 may be applied to a display panel including only the white emission layer as a common layer. In this instance, a color filter layer is additionally provided in the display panel.

Hereinafter, a display panel including a color filter layer will be described in detail with reference to FIGS. 13 and 14.

Figure 13:
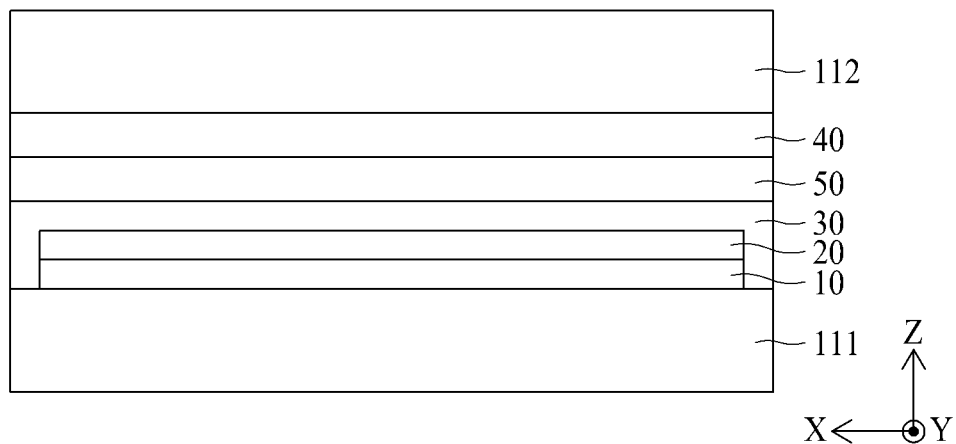
FIG. 13 is a cross sectional view illustrating one lateral side of a display panel according to another embodiment of the present invention.

FIG. 13 is a cross sectional view illustrating one lateral side of a display panel according to another embodiment of the present invention.

Referring to FIG. 13, the display panel 110 according to another embodiment of the present invention may include first and second substrates 111 and 112, a thin film transistor layer 10 disposed between the first and second substrates 111 and 112, an organic light emitting device layer 20, an encapsulation layer 30, a touch sensing layer 40, and a color filter layer 50.

The first substrate 111 may be a plastic film or a glass substrate.

The thin film transistor layer 10 is formed on the first substrate 111. The thin film transistor layer 10 may include scan lines, data lines, and thin film transistors. Each of the thin film transistors may include a gate electrode, a semiconductor layer, and source and drain electrodes. If a scan driver is formed in a gate driver in panel (GIP) method, the scan driver may be formed together with the thin film transistor layer 10.

The organic light emitting device layer 20 is formed on the thin film transistor layer 10. The organic light emitting device layer 20 may include first electrodes, organic light emitting layers, second electrodes, and banks. Each of the organic light emitting layers may include a hole transporting layer, a light emitting layer, and an electron transporting layer. In this instance, if a voltage is applied to the first and second electrodes, hole and electron are transferred to the light emitting layer through the hole transporting layer and the electron transporting layer, and are then combined in the light emitting layer, to thereby emit light. The pixels are prepared in an area for the organic light emitting device layer 20, and the area for the organic light emitting device layer 20 may be defined as a display area, and a peripheral area of the display panel may be defined as a non-display area.

The encapsulation layer 30 is formed on the organic light emitting device layer 20. The encapsulation layer 30 prevents moisture or oxygen from being permeated into the organic light emitting device layer 20. The encapsulation layer 30 may include at least one inorganic film.

The touch sensing layer 40 is formed on the encapsulation layer 30. The touch sensing layer 40 may include first and second touch electrodes so as to sense a user's touch. A cross sectional and plane structure of the touch sensing layer 40 will be described with reference to FIGS. 4 to 14.

The color filter layer 50 is formed on the touch sensing layer 40. The color filter layer 50 may include a plurality of color filters with different transmittance wavelength ranges, and a black matrix. Each of the color filters may be provided for each of the pixels prepared in the organic light emitting device layer 20. If the organic light emitting device layer 20 includes organic light emitting layers for emitting red, green, and blue light, it is possible to omit the color filter layer 50.

The second substrate 112 is formed on the color filter layer 50. The second substrate 112 functions as a cover substrate or a cover window for covering the first substrate 111. The second substrate 112 may be a plastic film, a glass substrate, an encapsulation film (protection film), or an optical film such as OLED transmittance controllable film (OTF).

Figure 14:
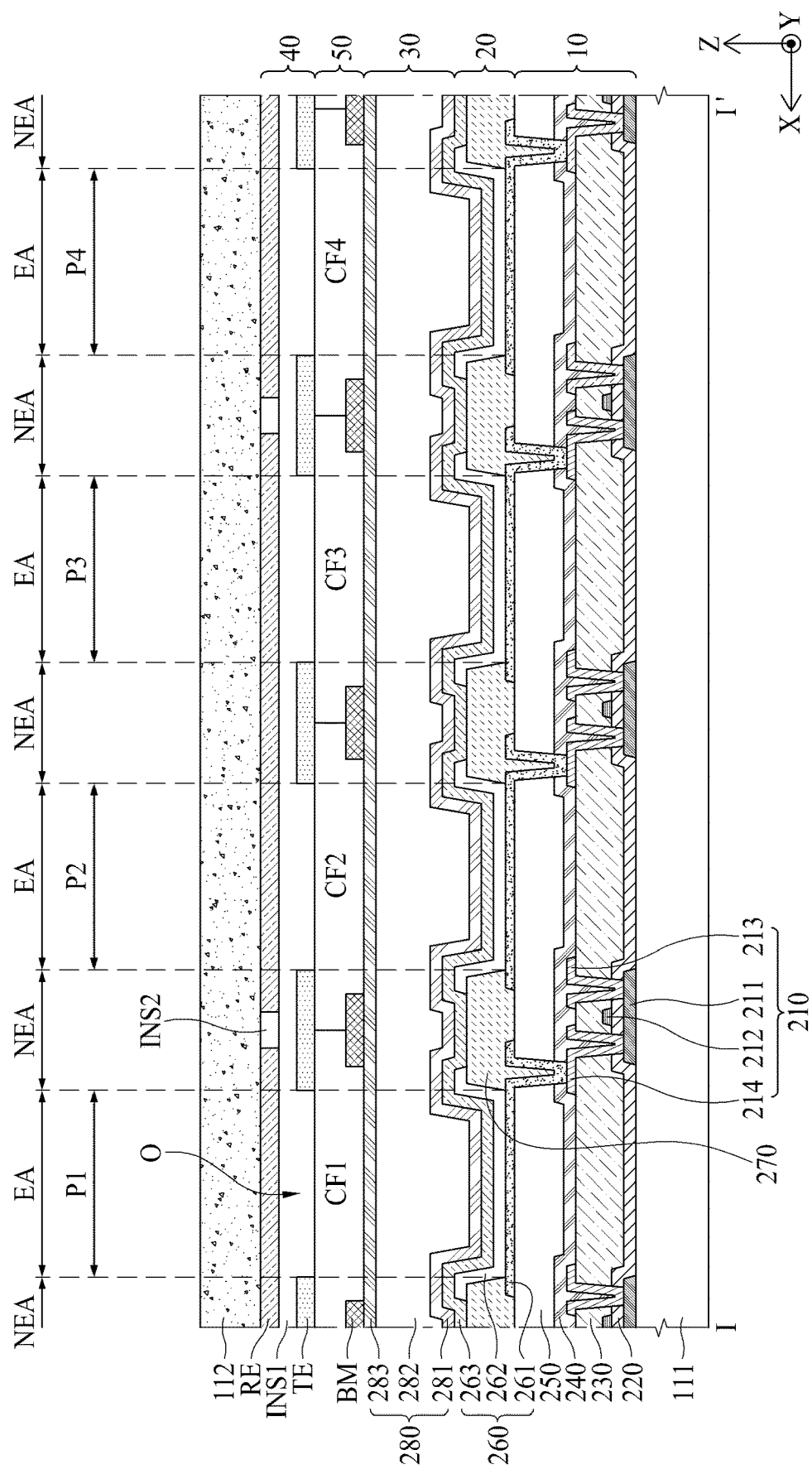
FIG. 14 is a cross sectional view illustrating another example along I-I' of FIG. 4.

FIG. 14 is a cross sectional view illustrating another example along I-I' of FIG. 4.

FIG. 14 shows that the touch sensing layer 40 shown in FIG. 4 is included in the display panel having a structure of FIG. 13. The display panel shown in FIG. 14 is different from the display panel shown in FIG. 5 since the display panel shown in FIG. 14 further includes the color filter layer 50. Herein, the thin film transistor layer 10 and the encapsulation layer 30 in the display panel of FIG. 14 are the same as those in the display panel of FIG. 5, whereby a detailed description for the thin film transistor layer 10 and the encapsulation layer 30 in the display panel of FIG. 14 will be omitted.

The thin film transistor layer 10 is formed on the first substrate 111. The thin film transistor layer 10 may includes thin film transistors 210, a gate insulating film 220, an insulating interlayer 230, a protection film 240, and a planarization film 250.

The organic light emitting device layer 20 is formed on the thin film transistor layer 10. The organic light emitting device layer 20 may include organic light emitting devices 260 and the bank 270.

The organic light emitting devices 260 and the bank 270 are provided on the planarization film 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be provided on the planarization film 250. The first electrode 261 may be connected with the drain electrode 214 of the thin film transistor 210 via a contact hole penetrating through the protection film 240 and the planarization film 250.

The bank 270 is provided to cover the edge of the first electrode 261 on the planarization film 250, to thereby divide the pixels (P1, P2, P3, P4). That is, the bank 270 functions as a pixel defining film so as to define the pixels (P1, P2, P3, P4).

The organic light emitting layer 262 is formed on the first electrode 261 and the bank 270. The organic light emitting layer 262 may be a common layer provided on the pixels (P1, P2, P3, P4) in common. In this instance, the organic light emitting layer 262 may be a white light emitting layer of emitting white light. If the organic light emitting layer 262 is the white light emitting layer, it may have a tandem structure of 2 stacks, or more than 2 stacks. Each stack may include a hole transporting layer, at least one light emitting layer, and an electron transporting layer.

The second electrode 263 is formed on the organic light emitting layer 262. The second electrode 263 may cover the organic light emitting layer 262. The second electrode 263 is a common layer provided on the pixels (P1, P2, P3, P4) in common.

The encapsulation layer 30 is formed on the organic light emitting device layer 20. The encapsulation layer 30 may include an encapsulation film 280. For example, the encapsulation film 280 may include a first inorganic film 281, an organic film 282, and a second inorganic film 283.

The touch sensing layer 40 is formed on the encapsulation layer 30. The touch sensing layer 40 may include first touch electrodes (TE), second touch electrodes (RE), and a first insulating film (INS1), and may further include a second insulating film (INS2) according to one embodiment of the present invention.

The first touch electrodes (TE) may be directly formed on an upper surface of the encapsulation layer 30. The first touch electrodes (TE) may extend in the first direction (X-axis direction), and an opening (O) corresponding to a light-emission area (EA) is formed. Accordingly, the first touch electrodes (TE) are not formed in the light-emission area (EA). The first touch electrodes (TE) are formed in a non-emission area (NEA) while being overlapped with the bank 270. Meanwhile, the first touch electrodes (TE) are disposed at fixed intervals along the second direction (Y-axis direction). In this instance, the interval between each of the first touch electrodes (TE) may be smaller than a width of the bank 270 in the second direction. That is, the interval between each of the first touch electrodes (TE) may be smaller than the interval between each of the pixels (P1, P2, P3, P4).

The first touch electrodes (TE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo).

As described above, the first touch electrodes (TE) are formed of the reflective metal material so that the first touch electrodes (TE) provide a mirror function as well as a touch function. In more detail, the first touch electrodes (TE) may provide another function in accordance with whether there is the emission of the pixel. If the pixels (P1, P2, P3, P4) emit light, the first touch electrodes (TE) receive a driving pulse from a first touch driver 181 through first touch lines (TL), whereby they provide the touch function. Meanwhile, if the pixels (P1, P2, P3, P4) do not emit light, the first touch electrodes (TE) reflect the incident light, whereby the first touch electrodes (TE) provide the mirror function.

The second touch electrodes (RE) may be provided on the first insulating film (INS1). The second touch electrodes (RE) may extend in the second direction (Y-axis direction). Unlike the first touch electrodes (TE), an opening (O) corresponding to the light-emission area (EA) is not formed in the second touch electrodes (RE). Accordingly, the second touch electrodes (RE) may be formed in the light-emission area (EA) as well as the non-emission area (NEA). Meanwhile, the second touch electrodes (RE) are disposed at fixed intervals along the first direction (X-axis direction). The second touch electrodes (RE) may be formed of a transparent metal material such as ITO or IZO.

The color filter layer 50 is formed on the touch sensing layer 40. The color filter layer 50 may include first to third color filters (CF1, CF2, CF3) having the different transmittance wavelength ranges, a fourth color filter (CF4), and the black matrix (BM). The first color filter (CF1) is a red color filter arranged in the first pixel (P1), the second color filter (CF2) is a green color filter arranged in the second pixel (P2), and the third color filter (CF3) is a blue color filter arranged in the third pixel (P3). The first color filter 311 may be formed of an organic film including red pigment, the second color filter 312 may be formed of an organic film including green pigment, and the third color filter 313 may be formed of an organic film including blue pigment.

Meanwhile, the fourth color filter (CF4) may be a transparent organic film arranged in the fourth pixel (P4). The transparent organic film may be formed of acryl resin, epoxy resin, phenolic resin, polyamide resin, or polyimide resin. FIG. 14 shows the fourth pixel (P4) and the fourth color filter (CF4), but not necessarily. It is possible to omit the fourth pixel (P4) and the fourth color filter (CF4) in other embodiments.

The black matrix (BM) may be disposed in the boundary lines of the first to fourth color filters (CF1, CF2, CF3, CF4) so as to prevent light of any one pixel from being mixed with light of the adjoining pixel. The black matrix (BM) may be formed in the non-emission area (NEA) while being overlapped with the bank 270. The black matrix (BM) may be formed of an organic film including a black pigment.

In FIGS. 13 and 14, the color filer layer 50 is formed on the touch sensing layer 40, but is not limited to this structure. According to another embodiment of the present invention, the color filter layer 50 may be formed on the encapsulation layer 30, and the touch sensing layer 40 may be formed on the color filter layer 50.

Meanwhile, FIGS. 3 to 14 show that at least one of the first touch electrodes (TE) and the second touch electrodes (RE) is directly formed on the encapsulation layer 30, but not limited to this structure. According to another embodiment of the present invention, the thin film transistor layer 10, the organic light emitting device layer 20, and the encapsulation layer 30 may be formed on the first substrate 111, the touch sensing layer 40 may be formed on the second substrate 112, and the encapsulation 30 of the first substrate 111 may be adhered to the touch sensing layer 40 of the second substrate 112 by the use of adhesive layer.

FIG. 15 is a flow chart illustrating a method for fabricating the display device with integrated touch screen according to one embodiment of the present invention. FIGS. 16A to 16G are cross sectional views illustrating the method for fabricating the display device with integrated touch screen according to one embodiment of the present invention.

First, the thin film transistor layer 10 is formed on the first substrate 111 (S1501).

Figure 16A:
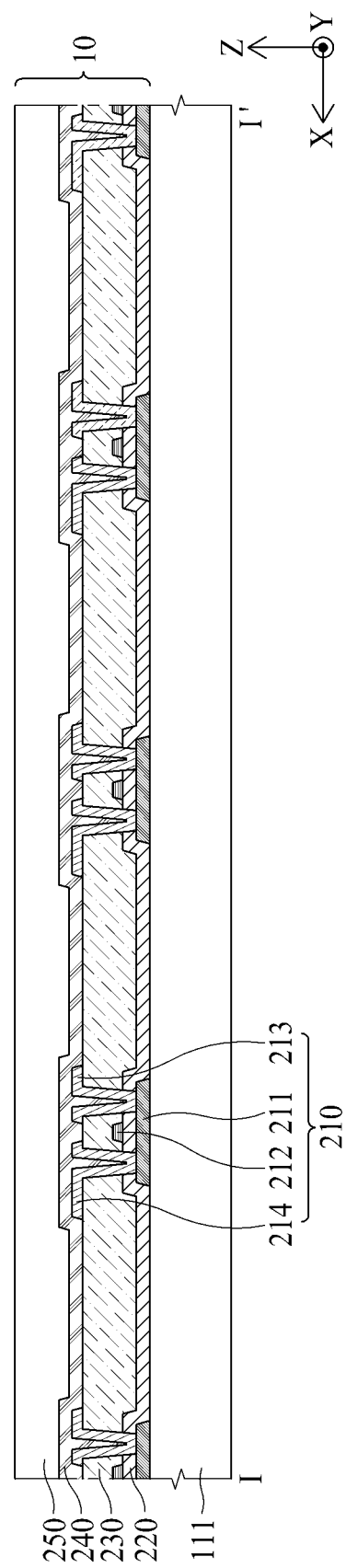

As shown in FIG. 16A, the thin film transistors 210 are formed on the first substrate 111. In detail, the buffer film is provided on the first substrate 111 so as to protect the thin film transistors 210 and organic light emitting devices 260 from moisture permeating through the first substrate 111 which is vulnerable to moisture permeability. The buffer film may be formed of a plurality of inorganic films alternately deposited. For example, the buffer film may be formed in a multi-layered structure by alternately depositing at least one inorganic film from a silicon oxide film (SiOx), a silicon nitride film (SiNx), and silicon oxynitride (SiON). The buffer film may be formed by chemical vapor deposition (CVD).

Then, the active layer 211 of the thin film transistor 210 is provided on the buffer film. In detail, an active metal layer is formed on an entire surface of the buffer film by sputtering or by metal organic chemical vapor deposition (MOCVD). Then, the active metal layer is patterned by a mask process using a photoresist pattern, to thereby form the active layer 211. The active layer 211 may be formed of a silicon-based or oxide-based semiconductor material.

Then, the gate insulating film 220 is formed on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 of the thin film transistor 210 may be provided on the gate insulating film 220. In detail, a first metal layer is formed on an entire surface of the gate insulating film 220 by sputtering or by metal organic chemical vapor deposition (MOCVD). Then, the first metal layer is patterned by a mask process using a photoresist pattern, to thereby form the gate electrode 212. The gate electrode 212 may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

Then, the insulating interlayer 230 may be provided on the gate electrode 212. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

Then, the contact holes for exposing the active layer 211 may be formed through the gate insulating film 220 and the insulating interlayer 230.

The source and drain electrodes 213 and 214 of the thin film transistor 210 are formed on the insulating interlayer 230. In detail, a second metal layer is formed on an entire surface of the insulating interlayer 230 by sputtering or by metal organic chemical vapor deposition (MOCVD). Then, the second metal layer is patterned by a mask process using a photoresist pattern, to thereby form the source and drain electrodes 213 and 214. Each of the source and drain electrodes 213 and 214 may be connected with the active layer 211 through the contact hole penetrating through the gate insulating film 220 and the insulating interlayer 230. The source and drain electrodes 213 and 214 may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

Then, the protection film 240 is formed on the source and drain electrodes 213 and 214 of the thin film transistor 210. The protection film 240 may be formed of an inorganic film. For example, the protection film 240 may be formed in a single-layered structure of the inorganic material such as silicon oxide (SiOx) or silicon nitride (SiNx), or a multi-layered structure of the above silicon oxide (SiOx) and silicon nitride (SiNx). The protection film 240 may be formed by a chemical vapor deposition (CVD) method.

The planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

Then, the organic light emitting device layer 20 is formed on the thin film transistor layer 10 (S1502).

Figure 16B:
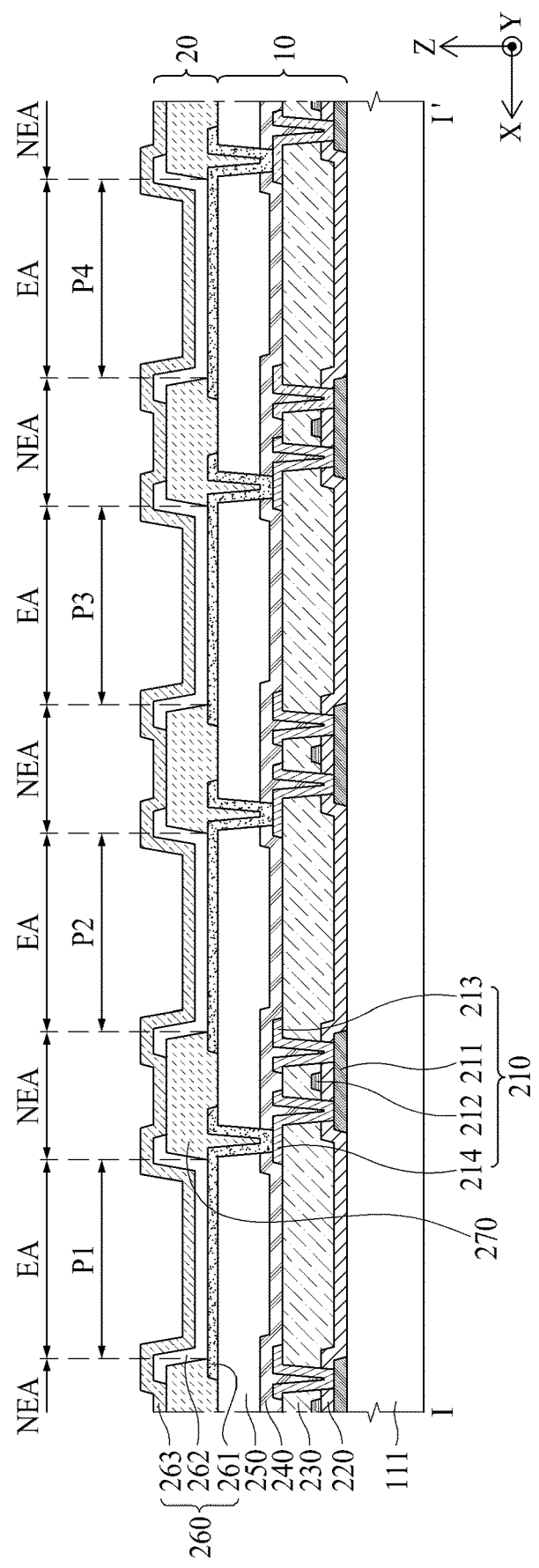

As shown in FIG. 16B, the organic light emitting device 260 are formed on the thin film transistor layer 10. The first electrode 261 of the organic light emitting device 260 is formed on the planarization film 250. In detail, a third metal layer is formed on an entire surface of the planarization film 250 by sputtering or by metal organic chemical vapor deposition (MOCVD). Then, the third metal layer is patterned by a mask process using a photoresist pattern, to thereby form the first electrode 261. The first electrode 261 may be connected with the drain electrode 214 of the thin film transistor 210 through the contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO).

The bank 270 is provided to cover the edge of the first electrode 261 on the planarization film 250, to thereby divide the pixels (P1, P2, P3). The bank 270 may be formed of an organic material, for example, acryl resin, epoxy resin, phenolic resin, polyamide resin, polyimide resin, and etc.

The organic light emitting layer 262 is formed on the first electrode 261 and the bank 270 by a deposition process or by a solution process. The organic light emitting layer 262 may include the red emission layer for emitting red light, the green emission layer for emitting green light, the blue emission layer for emitting blue light, and the white emission layer for emitting white light. The red emission layer may be provided on the first electrode 261 of the first pixel (P1), the green emission layer may be provided on the first electrode 261 of the second pixel (P2), the blue emission layer may be provided on the first electrode 261 of the third pixel (P3), and the white emission layer may be provided on the first electrode 261 of the fourth pixel (P4).

The organic light emitting layer 262 may be a common layer provided on the pixels (P1, P2, P3, P4) in common. In this instance, the organic light emitting layer 262 may be the white light emitting layer of emitting white light.

Then, the second electrode 263 is formed on the organic light emitting layer 262. The second electrode 263 may be a common layer provided on the pixels (P1, P2, P3) in common. The second electrode 263 may be formed of a transparent metal material (transparent conductive material, TCO) capable of transmitting light therethrough, for example, Indium Tin Oxide (ITO) or Indium Zinc Oxide (IZO). The second electrode 263 may be formed by a physical vapor deposition (PVD) method such as a sputtering method. The capping layer may be formed on the second electrode 263.

Then, the encapsulation layer 30 is formed on the organic light emitting device layer 20 (S1503).

Figure 16C:
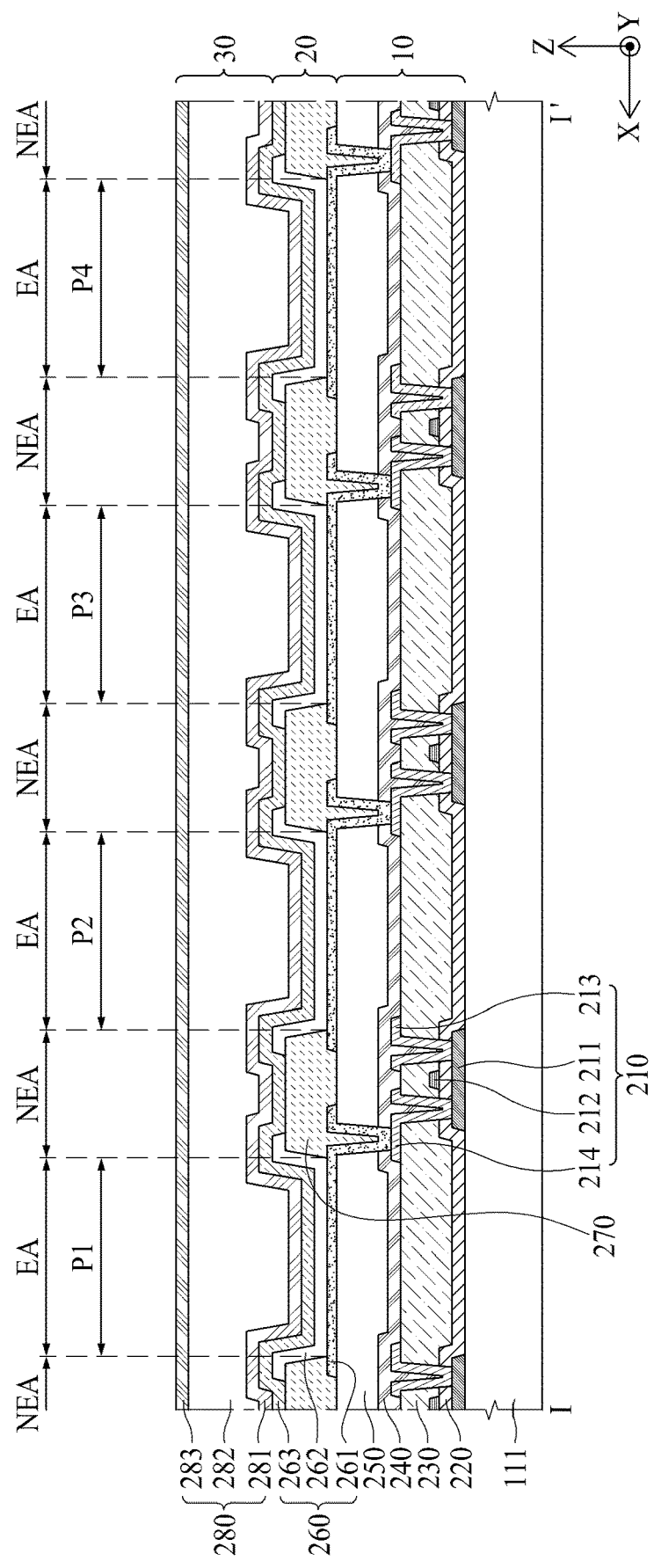

As shown in FIG. 16C, the encapsulation film 280 is formed on the second electrode 263. The encapsulation film 280 prevents a permeation of moisture or oxygen into the organic light emitting layer 262 and the second electrode 263. To this end, the encapsulation film 280 may include at least one inorganic film and at least one organic film.

For example, the encapsulation film 280 may include the first inorganic film 281, the organic film 282, and the second inorganic film 283. In this instance, the first inorganic film 281 may cover the second electrode 263. The organic film 282 may cover the first inorganic film 281. The organic film 282 may be formed at a thickness enough to prevent particles from getting into the organic light emitting layer 262 and the second electrode 263 through the first inorganic film 281, preferably. The second inorganic film 283 may cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, or titanium oxide. The organic film 282 may be formed of acryl resin, epoxy resin, phenolic resin, polyamide resin, polyimide resin, and etc.

Then, the first touch electrodes (TE) are formed on the encapsulation layer 30 (S1504).

Figure 16D:
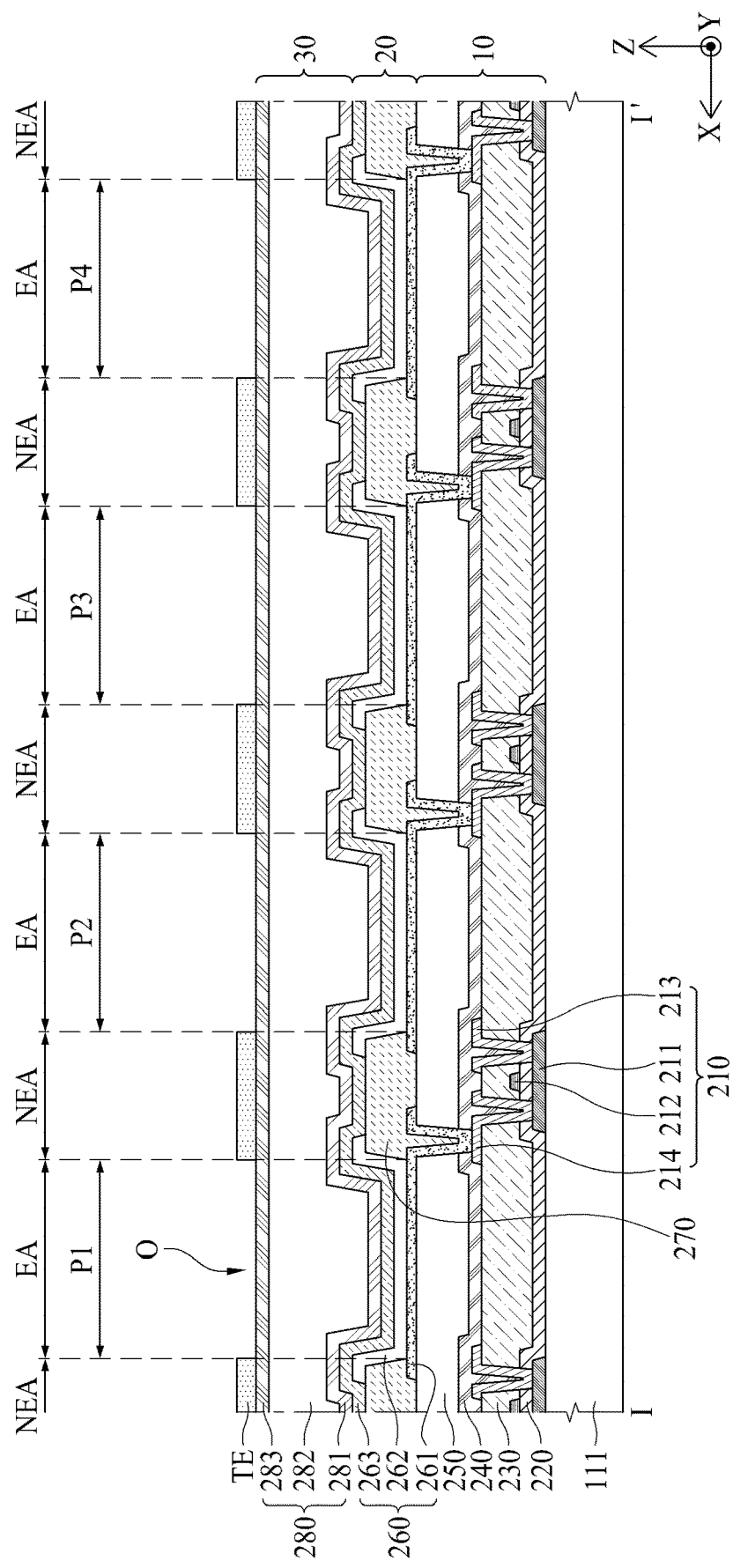

As shown in FIG. 16D, the first touch electrodes (TE) are formed on the encapsulation film 280. In detail, the first touch electrodes (TE) extend in the first direction (X-axis direction), and the opening (O) corresponding to the light-emission area (EA) is formed. Meanwhile, the first touch electrodes (TE) are provided at fixed intervals along the second direction (Y-axis direction). In this instance, the interval between each of the first touch electrodes (TE) may be smaller than the width of the bank 270 in the second direction. That is, the interval between each of the first touch electrodes (TE) may be smaller than the interval between each of the pixels (P1, P2, P3, P4).

The first touch electrodes (TE) may be formed of a reflective metal material capable of reflecting ambient light. For example, the reflective metal material may be aluminum (Al), chrome (Cr), silver (Ag), iron (Fe), platinum (Pt), nickel (Ni), or molybdenum (Mo). The first touch electrodes (TE) may be formed by a physical vapor deposition (PVD) method such as a sputtering method.

Then, the first insulating film (INS1) is formed on the first touch electrodes (TE) (S1505).

Figure 16E:
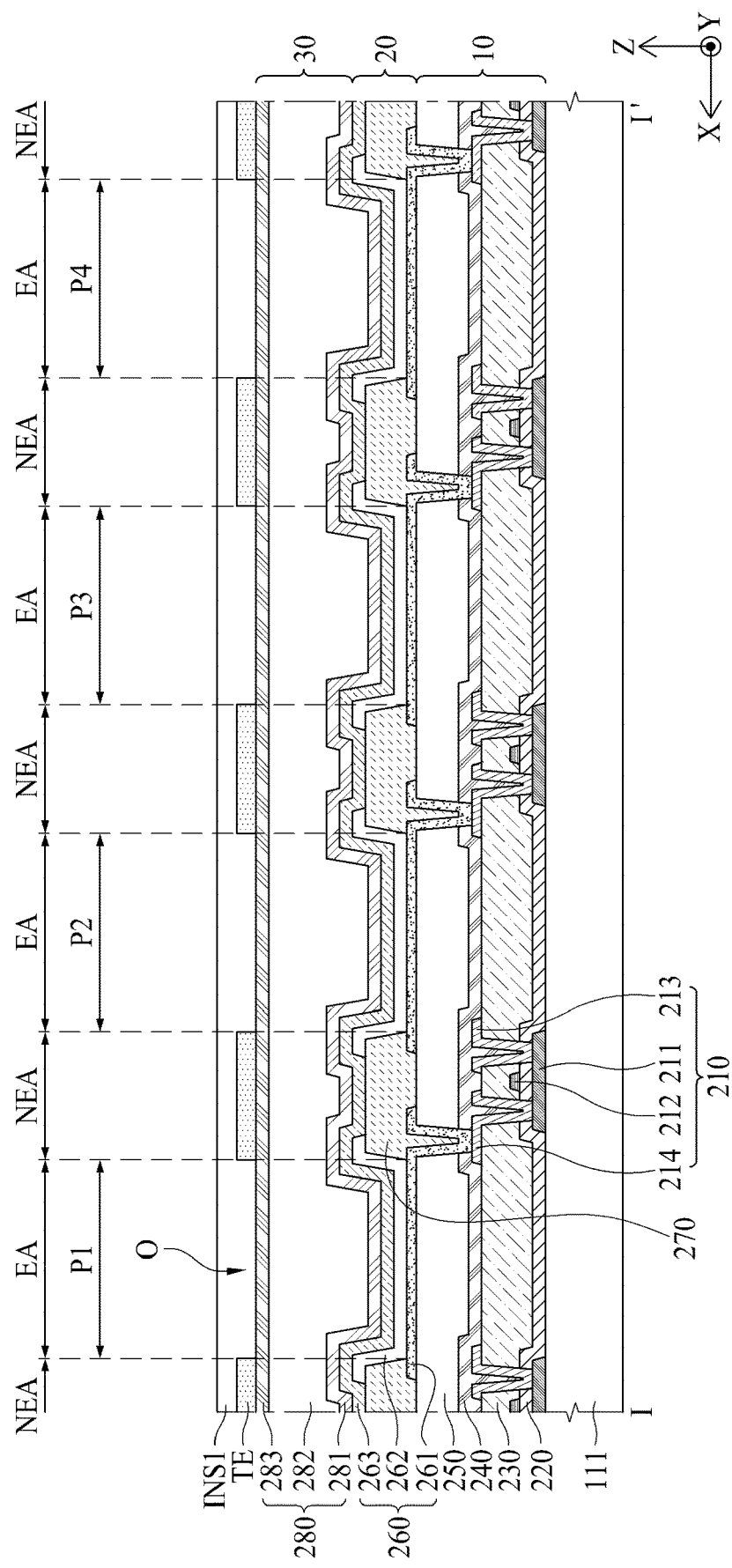

As shown in FIG. 16E, the first insulating film (INS1) may cover the first touch electrodes (TE). The first insulating film (INS1) may be formed in a single-layered structure of an inorganic material such as silicon oxide (SiOx) or silicon nitride (SiNx), or a multi-layered structure of the above silicon oxide (SiOx) and silicon nitride (SiNx).

Then, the second touch electrodes (RE) are formed on the first insulating film (INS1) (S1506).

Figure 16F:
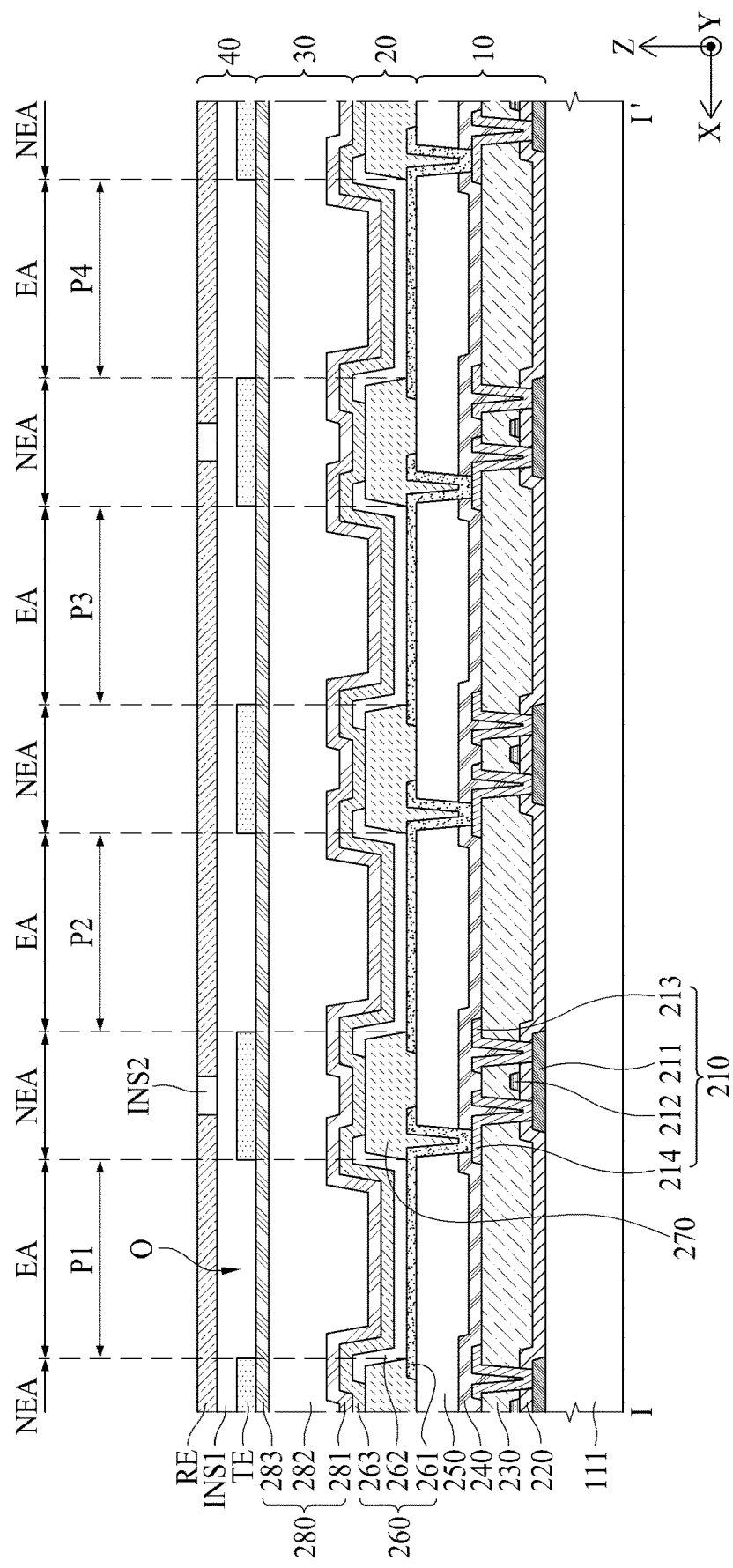

As shown in FIG. 16F, the second touch electrodes (RE) are formed on the first insulating film (INS1). In detail, the second touch electrodes (RE) extend in the second direction (Y-axis direction). The second touch electrodes (RE) are provided at fixed intervals along the first direction (X-axis direction).

The second touch electrodes (RE) may be formed of a transparent metal material such as ITO or IZO. The second touch electrodes (RE) may be formed by a physical vapor deposition method such as a sputtering method.

Then, the second insulating film (INS2) may be provided between each of the second touch electrodes (RE). The second insulating film (INS2) may be formed in a single-layered structure of an inorganic material such as silicon oxide (SiOx) or silicon nitride (SiNx), or a multi-layered structure of the above silicon oxide (SiOx) and silicon nitride (SiNx). It is possible to omit the second insulating film (INS2) in other embodiments.

Then, the first and second substrates 111 and 112 are bonded to each other (S1507).

As shown in FIG. 16G, the second substrate 112 is bonded onto the touch sensing layer 40. In detail, the touch sensing layer 40 of the first substrate 111 is adhered to the second substrate 112 by the use of adhesive layer so that it is possible to bond the first and second substrates 111 and 112 to each other. The adhesive layer may be a transparent optically clear resin layer (OCR) or a transparent optically clear adhesive film (OCA).

According to the embodiment of the present invention, the touch sensing layer 40 is directly formed on the encapsulation layer 30, whereby there is no need to align the first and second substrates 111 and 112 for the bonding process of the first and second substrates 111 and 112. Also, there is no need for an additional adhesive layer so that it is possible to reduce a thickness of the device.

According to the embodiment of the present invention, at least one of the first touch electrodes (TE) and the second touch electrodes (RE) may be formed of the reflective metal material, whereby they provide the mirror function. Accordingly, there is no need for an additional reflective film functioning as a mirror so that it is possible to minimize a thickness of the device.

According to the embodiment of the present invention, the opening (O) corresponding to the light-emission area is formed in the reflective metal material so that it is possible to prevent an aperture ratio from being deteriorated in the light-emission area. According to the embodiments to the present invention, the opening (O) may have various shapes, including rectangular shapes or other parallelograms, curved shapes such as circles or ovals, or any other shape, as long as the openings (0) are apertures.

According to the embodiment of the present invention, there is no need for an additional reflective film, which enables a simplified fabrication process in comparison to that of the related art display device with the mirror function. Also, it is possible to decrease the number of masks used for the fabrication process, and furthermore, the number of exposure, developing, etching, and cleaning processes. As a result, it is possible to decrease fabrication cost and time, and furthermore, to improve the yield by decreasing an error.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. A display device comprising:
a substrate including a light-emission area and a non-emission area;
a plurality of pixels arranged in the light-emission area and including a red sub pixel, a green sub pixel, and a blue sub pixel;
First touch electrodes extending in a first direction on the substrate; and second touch electrodes extending in a second direction on the substrate, wherein the second direction intersects the first direction,
wherein, among the first touch electrodes and the second touch electrodes, either the first touch electrodes or the second touch electrodes are provided with an opening corresponding to the light-emission area so that the other of the first touch electrodes or the second touch electrodes are formed in both the light-emission area and the non-emission area.

2. The display device according to claim 1, wherein the first touch electrodes or the second touch electrodes with the opening are formed of a reflective metal for reflecting ambient light.

3. The display device according to claim 1, further comprising an insulating film disposed between the first touch electrodes and the second touch electrodes.

4. The display device according to claim 3, wherein the first touch electrodes have the opening, and are formed of a reflective metal, and the second touch electrodes are formed of a transparent metal.

5. The display device according to claim 3, wherein the first touch electrodes have the opening, and are formed of a reflective metal.

6. The display device according to claim 1, wherein the first and second touch electrodes are disposed in the same layer, and the first and second touch electrodes are provided at a predetermined interval from each other.

7. The display device according to claim 6, further comprising bridge electrodes for electrically connecting the first touch electrodes with one another, wherein the bridge electrodes are disposed in the non-emission area,
wherein the first touch electrodes are connected with one another at intersections of the first and second touch electrodes in the first direction by the bridge electrodes.

8. The display device according to claim 7, further comprising an insulating film to cover the first and second touch electrodes,
wherein the bridge electrodes are provided to electrically connect adjacent first touch electrodes neighboring in the first direction through contact holes penetrating through the insulating film.

9. The display device according to claim 6, wherein the first touch electrodes have the opening, and are formed of a reflective metal.

10. The display device according to claim 1, further comprising:
a bank arranged in the non-emission area and provided to divide the plurality of pixels.

11. The display device according to claim 10, wherein the first touch electrodes are provided with an interval along the second direction, and the interval between adjacent two of the first touch electrodes is smaller than an interval between adjacent two of the plurality of pixels.

12. The display device according to claim 10, wherein the second touch electrodes are provided with an interval along the first direction, and the interval between adjacent two of the second touch electrodes is smaller than an interval between adjacent two of the plurality of pixels.

13. The display device according to claim 1, wherein the plurality of pixels further include white sub pixel.

14. The display device according to claim 1, further comprising:
an organic light emitting device arranged on the substrate; and
an encapsulation layer to cover the organic light emitting device,
wherein the first touch electrodes, the second touch electrodes, or both are directly formed on the encapsulation layer.

15. A method for fabricating a display device, the method comprising:
forming a plurality of pixels on a substrate including a light-emission area and a non-light emission area, and forming a bank to divide the plurality of pixels;
forming an encapsulation film to cover the plurality of pixels and the bank; and
forming first touch electrodes extending in a first direction and second touch electrodes in a second direction on the encapsulation film, wherein the first direction intersects the second direction,
wherein, among the first touch electrodes and the second touch electrodes, either the first touch electrodes or the second touch electrodes are provided with an opening corresponding to the bank so that the other of the first touch electrodes or the second touch electrodes are formed in both the light-emission area and the non-emission area.

16. The method according to claim 15, wherein the process of forming the first and second touch electrodes includes:
forming the first touch electrodes on the encapsulation film;
forming an insulating film on the first touch electrodes; and
forming the second touch electrodes on the insulating film.

17. The method according to claim 16, wherein the process of forming the first touch electrodes on the encapsulation film includes depositing a reflective metal layer so as to form the opening on the encapsulation film, and
the process of forming the second touch electrodes on the insulating film includes depositing a transparent electrode on the insulating film.

18. The method according to claim 16, wherein the process of forming the first touch electrodes on the encapsulation film includes depositing a transparent electrode on the encapsulation film, and
the process of forming the second touch electrodes on the insulating film includes depositing a reflective metal layer so as to form the opening on the insulating film.

19. The method according to claim 16, wherein the process of forming the first touch electrodes on the encapsulation film includes depositing a reflective metal layer so as to form the opening on the encapsulation film, and
the process of forming the second touch electrodes on the insulating film includes depositing a reflective metal layer so as to form the opening on the insulating film.

20. The method according to claim 15, wherein the process of forming the first and second touch electrodes includes providing the first touch electrodes with an interval along the second direction, wherein the interval between adjacent two of the first touch electrodes is smaller than an interval between adjacent two of the plurality of pixels.

21. The method according to claim 15, wherein the process of forming the first and second touch electrodes includes providing the second touch electrodes with an interval along the first direction, wherein the interval between adjacent two of the second touch electrodes is smaller than an interval between adjacent two of the plurality of pixels.

* * * * *